(12) United States Patent
Varanasi et al.

(10) Patent No.: US 11,441,817 B2
(45) Date of Patent: Sep. 13, 2022

(54) PHOTOTHERMAL TRAP

(71) Applicant: Massachusetts Institute of Technology, Cambridge, MA (US)

(72) Inventors: Kripa K. Varanasi, Lexington, MA (US); Susmita Dash, Bangalore (IN); Jolet De Ruiter, Enschede (NL)

(73) Assignee: Massachusetts Institute of Technology, Cambridge, MA (US)

(*) Notice: Subject to any disclaimer, the term of this patent is extended or adjusted under 35 U.S.C. 154(b) by 55 days.

(21) Appl. No.: 17/048,205

(22) PCT Filed: Nov. 9, 2018

(86) PCT No.: PCT/US2018/060009
§ 371 (c)(1),
(2) Date: Oct. 16, 2020

(87) PCT Pub. No.: WO2019/203894
PCT Pub. Date: Oct. 24, 2019

(65) Prior Publication Data
US 2021/0080150 A1 Mar. 18, 2021

Related U.S. Application Data

(60) Provisional application No. 62/711,343, filed on Jul. 27, 2018, provisional application No. 62/659,955, filed on Apr. 19, 2018.

(51) Int. Cl.
*F24S 20/61* (2018.01)
*F24S 70/20* (2018.01)
(Continued)

(52) U.S. Cl.
CPC ............ *F24S 20/61* (2018.05); *F24S 70/20* (2018.05); *F24S 80/56* (2018.05); *F24S 80/60* (2018.05);
(Continued)

(58) Field of Classification Search
CPC .. F24S 20/61; F24S 70/20; F24S 80/56; F24S 80/60; F24S 2080/03; F28D 15/0275; Y02E 60/14
(Continued)

(56) References Cited

U.S. PATENT DOCUMENTS 4,261,417 A * 4/1981 Tingley ................... F24S 10/75
165/47
8,424,513 B2 * 4/2013 Oetting ................... F24S 70/20
126/714
(Continued)

FOREIGN PATENT DOCUMENTS

| WO | WO 2013/022467 A2 | 2/2013 |
| WO | WO 2013/141888 A1 | 9/2013 |
| WO | WO 2014/078867 A1 | 5/2014 |

OTHER PUBLICATIONS

Thermal Conductivity, Solid Phase. Retrieved from https://app.knovel.com/hotlink/toc/id:kt0129GBO1/dippr-project-801-full/temperatur-thermal-conductivity (Year: 2020).*

(Continued)

*Primary Examiner* — Steven B McAllister
*Assistant Examiner* — Cole N Friedman
(74) *Attorney, Agent, or Firm* — Wolf, Greenfield & Sacks, P.C.

(57) ABSTRACT

Articles, systems, and methods in which electromagnetic energy is converted to heat (e.g., for the purpose of inducing or inhibiting phase change of a material disposed over a surface) are generally described.

19 Claims, 16 Drawing Sheets

(51) Int. Cl.
*F24S 80/60* (2018.01)
*F24S 80/56* (2018.01)
*F28D 15/02* (2006.01)
*F24S 80/00* (2018.01)

(52) U.S. Cl.
CPC ....... *F28D 15/0275* (2013.01); *F24S 2080/03* (2018.05)

(58) Field of Classification Search
USPC .................................. 126/701, 714, 569, 618
See application file for complete search history.

(56) References Cited

U.S. PATENT DOCUMENTS

| | | | |
|---|---|---|---|
| 9,010,315 B2* | 4/2015 | Liu | F24S 70/20 126/707 |
| 9,671,137 B2* | 6/2017 | Mercs | G02F 1/0126 |
| 2008/0276837 A1 | 11/2008 | Bhamidipati | |
| 2009/0247654 A1* | 10/2009 | Rajendran | C08J 9/0066 521/60 |
| 2009/0260667 A1 | 10/2009 | Chen et al. | |
| 2010/0317140 A1* | 12/2010 | Brailove | H01L 31/0392 438/57 |
| 2011/0012264 A1 | 1/2011 | Linderman et al. | |
| 2012/0031464 A1 | 2/2012 | Johnston et al. | |
| 2014/0048059 A1* | 2/2014 | Andritschky | C23C 14/0676 204/192.28 |
| 2014/0266967 A1 | 9/2014 | Ramahi et al. | |
| 2016/0296985 A1* | 10/2016 | Dhiman | B08B 17/065 |
| 2019/0360739 A1* | 11/2019 | Brown | E01D 19/16 |

OTHER PUBLICATIONS

Heatspreader Materials, Aug. 4, 2020, ALMT Corp. (Year: 2020).*
Alizadeh et al., Dynamics of ice nucleation on water repellent surfaces. Langmuir. Feb. 14, 2012;28(6):3180-6. doi: 10.1021/la2045256. Epub Jan. 30, 2012.
Allen et al., A method for calculating heat transfer in the laminar flow region of bodies. National Advisory Committee for Aeronautics (NACA) Wartime Report, Dec. 1942. 473 pages.
Anand et al., Enhanced condensation on lubricant-impregnated nanotextured surfaces. ACS Nano. Nov. 27, 2012;6(11):10122-9. doi: 10.1021/nn303867y. Epub Oct. 10, 2012.
Azimi et al., Superhydrophobic surfaces by laser ablation of rare-earth oxide ceramics. MRS Comm. Sep. 10, 2014;4(3):95-99.
Baffou et al., Photoinduced heating of nanoparticle arrays. ACS Nano; Jul. 2013;7(8):6478-6488. Epub Jul. 27, 2013.
Baffou et al., Super-heating and micro-bubble generation around plasmonic nanoparticles under cw illumination. J. Phys. Chem. C. Jan. 8, 2014;118(9):4890-4898.
Bird et al., Reducing the contact time of a bouncing drop. Nature. Nov. 21, 2013;503(7476):385-8. doi: 10.1038/nature12740.
Blake et al., Simulating the freezing of supercooled water droplets impacting a cooled substrate. AIAA Journal; Jan. 13, 20143;53(7):1-21.
Cheng et al, Magnetic particles-based super-hydrophobic coatings with excellent anti-icing and thermoresponsive deicing performances. J. Mater. Chem. A. Sep. 4, 2015;3(43):21637-21646.
Dalili et al., A review of surface engineering issues critical to wind turbine performance. Renew. Sustain. Energy Rev. Feb. 2009:13(2):428-438. Epub Dec. 5, 2007.
Dash et al., Conference Abstract: Melting frozen droplets using photo-thermal traps. The American Physical Society; MIT; Submitted Aug. 1, 2017; 1 page.
Dash et al., Melting frozen droplets using photo-thermal traps. MIT; APS DFD Presentation; Nov. 19, 2017; 11 pages.
Enriquez et al., Freezing singularities in water drops. Phys. Fluids Sep. 2012;24:091102(1-2).

Esser-Kahn et al., Incorporation of antifreeze proteins into polymer coatings using site-selective bioconjugation. J Am Chem Soc. Sep. 29, 2010;132(38):13264-9. doi: 10.1021/ja103038p.
Farzaneh et al., Anti-icing and de-icing techniques for overhead lines. In: Atmospheric Icing of Power Networks. Springer, Berlin. Aug. 2008; 388 pages.
Fortin et al., Heat and mass transfer during ice accretion on aircraft wings with an improved roughness model. Intl. J. Therm. Sci. Jun. 2006;45(6):595-606. Epub Sep. 28, 2005.
Golovin et al., Designing durable icephobic surfaces. Sci Adv. Mar. 11, 2016;2(3):e1501496. doi: 10.1126/sciadv.1501496.
Govorov et al., Generating heat with metal nanoparticles. Nano Today. Feb. 2007;2(1):30-38.
Graeber et al., Spontaneous self-dislodging of freezing water droplets and the role of wettability. Proc Natl Acad Sci U S A. Oct. 17, 2017;114(42):11040-11045. doi: 10.1073/pnas.1705952114. Epub Sep. 25, 2017.
Jung et al., Are superhydrophobic surfaces best for icephobicity? Langmuir. Mar. 15, 2011;27(6):3059-66. doi: 10.1021/la104762g. Epub Feb. 14, 2011.
Jung et al., D. Mechanism of supercooled droplet freezing on surfaces. Nat Commun. Jan. 10, 2012;3:615(1-8). doi: 10.1038/ncomms1630.
Jung et al., Frost halos from supercooled water droplets. Proc Natl Acad Sci U S A. Oct. 2, 2012;109(40):16073-8. doi: 10.1073/pnas.1206121109. Epub Sep. 10, 2012.
Kim et al., Liquid-infused nanostructured surfaces with extreme anti-ice and anti-frost performance. ACS Nano. Aug. 28, 2012;6(8):6569-77. doi: 10.1021/nn302310q. Epub Jun. 15, 2012.
King, W.D., Freezing rates of water droplets. J. Atmospheric Sci. Feb. 1, 1975;32(2):403-408.
Lv et al., Bio-inspired strategies for anti-icing. ACS Nano. Apr. 22, 2014;8(4):3152-69. doi: 10.1021/nn406522n. Epub Mar. 10, 2014.
Maitra et al., on the nanoengineering of superhydrophobic and impalement resistant surface textures below the freezing temperature. Nano Lett. Jan. 8, 2014;14(1):172-82. doi: 10.1021/nl4037092. Epub Dec. 9, 2013.
Maitra et al., Supercooled water drops impacting superhydrophobic textures. Langmuir. Sep. 16, 2014;30(36):10855-61. doi: 10.1021/la502675a. Epub Sep. 5, 2014.
Marin et al., Universality of tip singularity formation in freezing water drops. Phys Rev Lett. Aug. 1, 2014;113(5):054301(1-5). doi: 10.1103/PhysRevLett.113.054301. Epub Jul. 31, 2014.
Meuler et al., Relationships between water wettability and ice adhesion. ACS Appl Mater Interfaces. Nov. 2010;2(11):3100-10. doi: 10.1021/am1006035. Epub Oct. 15, 2010.
Mishchenko et al., Design of ice-free nanostructured surfaces based on repulsion of impacting water droplets. ACS Nano. Dec. 28, 2010;4(12):7699-707. doi: 10.1021/nn102557p. Epub Nov. 9, 2010.
Ni et al., Steam generation under one sun enabled by a floating structure with thermal concentration. Nat. Energy. Aug. 22, 2016;1:16126.
Palyvos, J.A., A survey of wind convection coefficient correlations for building envelope energy systems' modeling. Appl. Therm. Eng. Jun. 2008;28(8-9):801-808. Epub Dec. 15, 2007.
Parent et al. Anti-icing and de-icing techniques for wind turbines: Critical review. Cold Reg. Sci. Technol. Jan. 2011;65(1):88-96. Epub Jan. 15, 2010.
Ramakrishna et al., Environmental impact of chemical deicers—a review. Water Air Soil Pollut. Sep. 2005:166:49-63.
Richardson et al., Thermooptical properties of gold nanoparticles embedded in ice: characterization of heat generation and melting. Nano Lett. Apr. 2006;6(4):783-8. doi: 10.1021/nl0601051. Epub Mar. 18, 2006.
Richardson et al., Experimental and theoretical studies of light-to-heat conversion and collective heating effects in metal nanoparticle solutions. Nano Lett. Mar. 2009;9(3):1139-46. doi: 10.1021/nl8036905.
Ryerson, C.C., Ice protection of offshore platforms. Cold Reg. Sci. Technol. Jan. 2011;65(1):97-110.
Rykaczewski et al., Mechanism of frost formation on lubricant-impregnated surfaces. Langmuir. Apr. 30, 2013;29(17):5230-8. doi: 10.1021/la400801s. Epub Apr. 22, 2013.

(56) References Cited

OTHER PUBLICATIONS

Subramanyam et al., Ice adhesion on lubricant-impregnated textured surfaces. Langmuir. Nov. 5, 2013;29(44):13414-8. doi: 10.1021/la402456c. Epub Oct. 21, 2013.

Suke, P., Analysis of heating systems to mitigate ice accretion on wind turbine blades. McMaster University. Mechanical Engineering. Thesis. Jan. 2014. 130 pages.

Sun et al., Bioinspired stimuli-responsive and antifreeze-secreting anti-icing coatings. Adv. Mater. Interfaces. Mar. 23, 2015;2(5):1400479. Epub Feb. 23, 2015.

Tang et al., Estimation of broadband surface emissivity from narrowband emissivities. Optics Express. Jan. 3, 2011;19(1):185-192.

Tourkine et al., Delayed freezing on water repellent materials. Langmuir. Jul. 7, 2009;25(13):7214-6. doi: 10.1021/la900929u.

Varanasi et al., Frost formation and ice adhesion on superhydrophobic surfaces. Appl. Phys. Lett. Nov. 7, 2010; 97(23):234102(1-3).

Wang et al., Experimental correlation of forced convection heat transfer from a NACA airfoil. Exp.Therm. Fluid Sci. Aug. 2007;31(8):1073-1082. Epub Dec. 20, 2006.

Yin et al., Integration of self-lubrication and near-infrared photothermogenesis for excellent anti-icing/deicing performance. Adv. Funct. Mater. Jul. 15, 2015;25(27):4237-4245. Epub May 29, 2015.

International Search Report and Written Opinion dated Feb. 28, 2019 in PCT/US2018/060009.

Dash et al. "Photothermal trap utilizing solar illumination for ice mitigation," Science Advances. Aug. 31, 2018. vol. 4(8) pp. 1-7.

PCT/US2018/060009, Feb. 28, 2019, International Search Report and Written Opinion dated Feb. 28, 2019.

\* cited by examiner

PHOTOTHERMAL TRAP

RELATED APPLICATIONS

This application is a national stage filing under 35 U.S.C. § 371 of International Patent Application Serial No. PCT/US2018/060009, filed Nov. 9, 2018, and entitled "Photothermal Trap," which claims priority under 35 U.S.C. § 119(e) to U.S. Provisional Application No. 62/659,955, filed Apr. 19, 2018, and entitled "Photothermal Trap for Ice Mitigation," and to U.S. Provisional Application No. 62/711,343, filed Jul. 27, 2018, and entitled "Photothermal Trap," each of which is incorporated herein by reference in its entirety for all purposes.

TECHNICAL FIELD

The conversion of electromagnetic energy to heat, for example, for the purpose of inducing or inhibiting phase change of a material disposed over a surface is generally described.

BACKGROUND

Ice buildup via frost formation, condensate freezing, and freezing rain poses significant operational and safety challenges in wind turbines, power lines, residential houses, airplanes, condenser surfaces, and offshore platforms. For instance, ice accretion on wind turbines in cold regions and at high altitudes can result in a loss of up to 50% of the annual production. Current methods for ice removal include mechanical means such as raking, shoveling and hammering, and thermal means, all of which are generally inefficient and energy intensive. Chemical methods include use of deicing fluids and salts that are often corrosive and environmentally unfriendly.

In recent years, there have been efforts to delay or prevent ice formation using surface modifications, including superhydrophobic surfaces, polymer coatings, lubricant-impregnated surfaces, coatings comprising phase change, and anti-freeze materials. The workability of superhydrophobic surfaces is generally limited under humid conditions because of condensation freezing and frost-induced failure of superhydrophobicity, leading to increased ice adhesion. The depletion of the lubricant via cloaking, evaporation, or capillary wicking into the ice structure can deem lubricant impregnated surfaces unsuitable for long-term anti-icing. These passive anti-icing methods, though promising, are insufficient to eliminate ice formation. Recent studies have demonstrated the use of plasmonic and magnetic particles to design photothermal surfaces that yield significant temperature increase under absorption of light. However, their scalability is generally limited by costs and the need for microfabrication, while heating is generally strongly localized to the incident light beam and the immediate vicinity of the particles.

Accordingly, improved systems and methods for mitigating ice formation and for otherwise inducing phase change disposed over a surface would be desirable.

SUMMARY

Articles, systems, and methods in which electromagnetic energy is converted to heat (e.g., for the purpose of inducing or inhibiting phase change of a material disposed over a surface) are generally described. The subject matter of the present invention involves, in some cases, interrelated products, alternative solutions to a particular problem, and/or a plurality of different uses of one or more systems and/or articles.

In some embodiments, a photothermal trap is provided. The photothermal trap may comprise a thermal spreader and an absorber over the thermal spreader. In some embodiments, the absorber is configured to absorb electromagnetic radiation. In some embodiments, the photothermal trap is configured such that at least a portion of the electromagnetic radiation absorbed by the absorber is converted to heat that is transferred to the thermal spreader.

In some embodiments, a photothermal trap comprising a first region and a second region over the first is described. In some embodiments, the first region has a thermal conductivity in a lateral direction of at least 50 W $m^{-1}$ $K^{-1}$ at 25° C. In some embodiments, the second region has an absorptivity of at least 50% with respect to at least one wavelength of electromagnetic radiation within a band of wavelengths from 200 nm to 1 µm.

In another aspect, methods of inducing or inhibiting a phase change of a material disposed over an article are described. In some cases, the article has a thickness and a lateral dimension perpendicular to the thickness. The methods may comprise exposing the article to electromagnetic radiation, such that the electromagnetic radiation is absorbed by a first area of the article and converted to heat. The heat may, in some embodiments, be transported along the lateral dimension of the article to a second area of the article resulting in the inducing or inhibiting of the phase change of the material over the second area of the article.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Methods and articles related to the conversion of electromagnetic radiation into heat for the purpose of inducing or inhibiting a phase change of a material are generally described. In some embodiments, a photothermal trap comprising an absorber and a thermal spreader is employed. In some embodiments, the absorber is exposed to electromagnetic radiation, which it captures and transfers to heat, and the heat is transferred to a thermal spreader, which conducts the heat laterally in order to more evenly raise the temperature across the surface of the photothermal trap. In some embodiments, the absorber and thermal spreader are situated over a thermally insulating layer such that generated heat is kept near the surface of the photothermal trap that is exposed to the electromagnetic radiation. As a non-limiting example in accordance with certain embodiments, the absorber is a thin layer of cermet possessing a high degree of absorptivity and low degree of emissivity of visible light, coated on top of the thermal spreader, which is a layer of metal (e.g., aluminum). In this exemplary embodiment, the cermet layer and the metal layer are optionally placed on top of a thermally insulating foam. In such an embodiment, upon exposure to visible light, such as from the sun, the cermet converts a high percentage of the light to heat, which is transferred to the metal layer, which then spreads the heat to other areas of the photothermal trap.

In accordance with certain embodiments, ice or water residing on top of the photothermal trap is warmed by the heat generated by the converted electromagnetic radiation such that at least a portion of the ice melts or at least a portion of the water is prevented from freezing. In some non-limiting embodiments, the surface of the photothermal trap is hydrophobic, such that melted ice and/or unfrozen water may easily slide off the surface of the photothermal trap or be removed mechanically.

In some embodiments, the photothermal trap allows for the efficient transfer of heat from an area that is exposed to electromagnetic radiation to an area that is less exposed to electromagnetic radiation. This, in accordance with certain embodiments, can be useful for using heat to induce or inhibit the phase change of a material with energy from electromagnetic radiation, even when that material is not exposed to a significant amount (or any) of the electromagnetic energy to which the photothermal trap is exposed. For example, in some embodiments, the photothermal trap is configured such that energy from electromagnetic radiation that is incident on a first portion of the trap melts ice disposed over a second portion of the trap, even if the second portion of the trap is disposed over a shaded area.

Figure 1A:
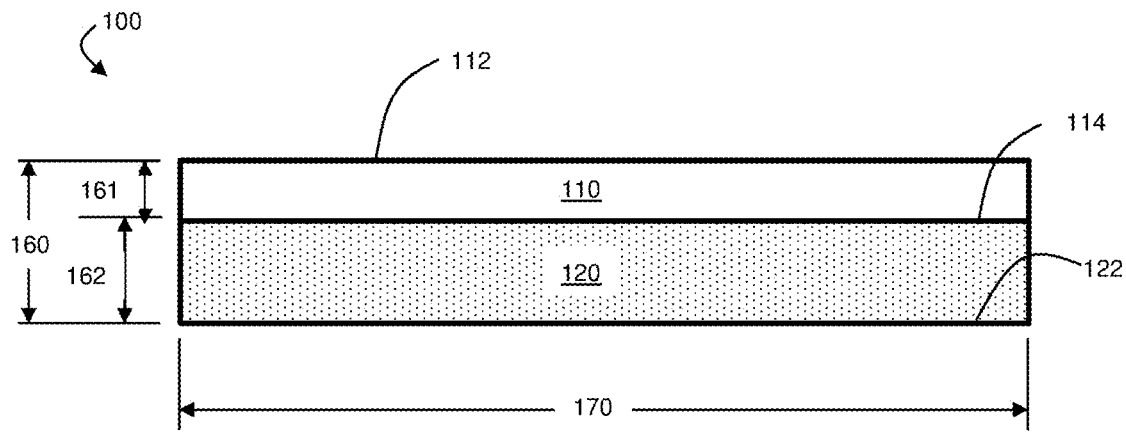
FIG. 1A shows an exemplary cross-sectional schematic of a photothermal trap, according to some embodiments.

Certain embodiments are related to photothermal traps. For example, FIG. 1A shows an exemplary schematic of photothermal trap 100.

In some embodiments, the photothermal trap comprises a region that transfers heat relatively efficiently (e.g., by having a high thermal conductivity or effective thermal conductivity). The region that transfers heat efficiently is generally referred to herein as a thermal spreader. For example, referring back to FIG. 1A, photothermal trap 100 comprises thermal spreader 120.

In some embodiments, the photothermal trap comprises a region that absorbs electromagnetic radiation relatively efficiently. The region that absorbs electromagnetic radiation relatively efficiently is generally referred to herein as an absorber. The absorber may be disposed over the thermal spreader. For example, photothermal trap 100 in FIG. 1A, in accordance with certain embodiments, comprises absorber 110 over thermal spreader 120. In some embodiments, the absorber is disposed directly over the thermal spreader. In some embodiments, there is an intervening structure, such as a layer or gap, between the thermal spreader and the absorber disposed over the thermal spreader.

In some embodiments, the photothermal trap can be configured such that at least a portion of the electromagnetic radiation absorbed by the absorber is converted to heat that is transferred to the thermal spreader. For example, photothermal trap 100 can be configured, in accordance with certain embodiments, such that when absorber 110 is exposed to electromagnetic radiation (at outer surface 112 of the absorber, for example), absorber 110 absorbs the electromagnetic radiation and converts a portion of it to heat, which is transferred to thermal spreader 120.

In some embodiments, the photothermal trap has a thickness and a lateral dimension perpendicular to the thickness. For example, referring back to FIG. 1A, photothermal trap 100 has thickness 160 extending from outer surface 112 of absorber 110 to back surface 122 of thermal spreader 120. In FIG. 1A, photothermal trap 100 also has lateral dimension 170 perpendicular to thickness 160.

In certain embodiments, the photothermal trap facilitates the transfer (e.g., conduction) of heat along the lateral dimension. Such a spreading of heat may be useful in inducing or inhibiting a phase change of a material disposed over the photothermal trap. For example, referring to FIG. 1C, a material capable of changing phase may be disposed on top of photothermal trap 100, in accordance with certain embodiments. When the photothermal trap is exposed to electromagnetic radiation, the electromagnetic radiation may be absorbed at a first area of the photothermal trap and converted to heat. For example, referring to FIG. 1C, the electromagnetic radiation may, in certain embodiments, be absorbed and converted to heat at first area 152 in photothermal trap 100. In some embodiments, the heat is transported along the lateral dimension to a second area of the photothermal trap. The material capable of changing phase may be disposed over the second area such that the transfer of heat from the first area to the second area results in the inducing or inhibiting of the phase change of the material. For example, referring to in FIG. 1C, in accordance with certain embodiments, a material capable of changing phase may be sitting over second area 154 of photothermal trap 100, such that when heat is transferred from first area 152 to second area 154, the heat either induces or inhibits the phase change of the material.

In some embodiments, a portion of the heat that is transported along the lateral dimension of the photothermal trap is first transported along the thickness direction of the photothermal trap. For example, referring to FIG. 1C, in some embodiments, a portion of the heat generated at first area 152 over absorber 110 is transferred in the thickness direction of photothermal trap 100 to thermal spreader 120, at which point that heat is transported in the lateral dimension to the area of thermal spreader 120 underneath second area 154. In some such embodiments, once the heat is at the area of thermal spreader 120 underneath second area 154, it may be transferred (e.g. by thermal conduction or convection) back along the thickness to second area 154.

Figure 1B:
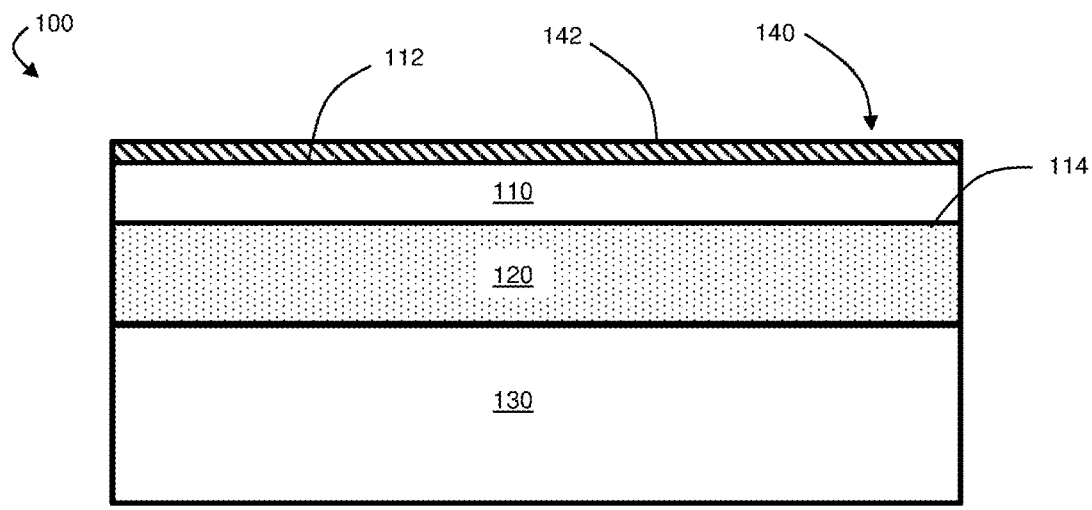
FIG. 1B shows an exemplary cross-sectional schematic of a photothermal trap with additional optional components, according to some embodiments.
Figure 1C:
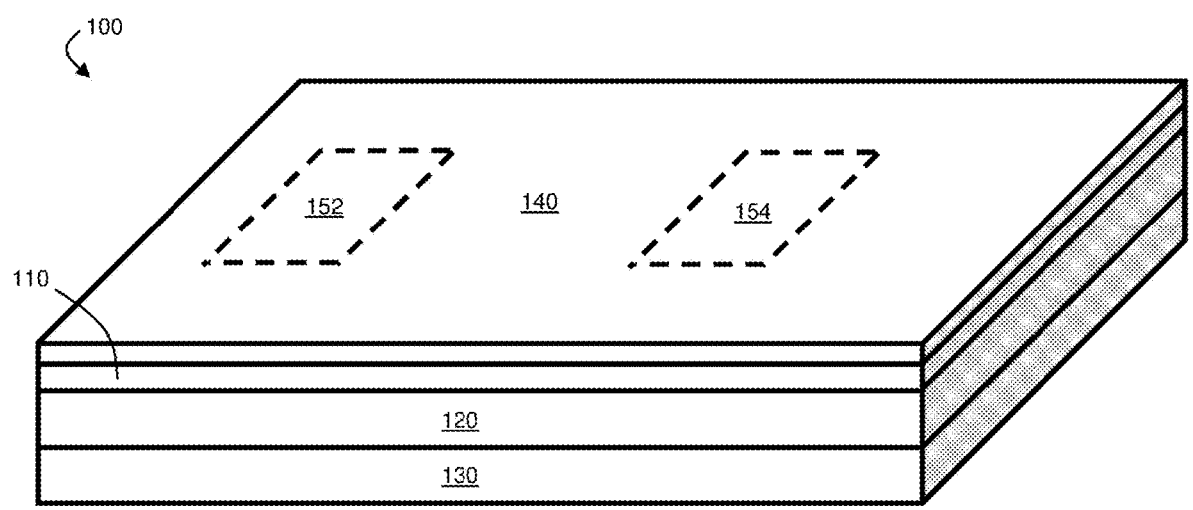
FIG. 1C shows a schematic of a photothermal trap, according to some embodiments.

In some embodiments the photothermal trap comprises a thermally insulating region disposed underneath the region or regions within which the absorption and the heat transportation occur. In some embodiments, the photothermal trap further comprises a thermal insulator under the thermal spreader. An exemplary embodiment is shown in FIG. 1B, which shows thermal insulator 130 disposed under thermal spreader 120. The photothermal trap may be configured such that comparatively little heat is transferred between the thermal spreader and the thermal insulator, so that heat generated by the photothermal trap remains close to the surface upon which electromagnetic radiation is incident. In other words, in some embodiments, the photothermal trap is configured such that heat can be transferred a greater distance along the lateral dimension than along the thickness of the photothermal trap. In some embodiments, the thermal insulator is disposed directly underneath the thermal spreader. In some embodiments, there is an intervening structure, such as a layer or gap, between the thermal insulator and the thermal spreader underneath which the thermal insulator is disposed.

In certain embodiments in which the photothermal trap comprises a first area exposed to electromagnetic radiation and a second area, the second area is exposed to a lower flux of electromagnetic radiation than in the first area. For example, referring to FIG. 1C, in some embodiments, photothermal trap 100 is exposed to electromagnetic radiation such that second area 154 is exposed to a lower flux than is first area 152.

As mentioned above, in some embodiments, the photothermal trap comprises a region that absorbs electromagnetic radiation. For example, referring to FIG. 1A, photothermal trap 100, comprises absorber 110, which absorbs electromagnetic radiation.

In some embodiments, when the photothermal trap is exposed to electromagnetic radiation, the absorber absorbs at least a portion of the electromagnetic radiation. A portion of electromagnetic radiation is absorbed by a material if the portion of radiation is converted to a different form of energy by the medium (such as heat or chemical energy) and is neither reflected nor transmitted through the material. For example, referring to FIG. 1A, in accordance with certain embodiments, when absorber 110 absorbs a portion of electromagnetic radiation incident upon outer surface 112, the portion of electromagnetic radiation is neither reflected off outer surface 112 nor is it transmitted through absorber 110 past inner surface 114.

In some embodiments, the absorber of the photothermal trap has a relatively high absorptivity. The absorptivity of a material is the ratio of absorbed electromagnetic power to incident electromagnetic power, and can be expressed as a percentage. The absorptivity of a material can vary as a function of wavelength of electromagnetic radiation. Having a relatively high absorptivity can allow, in accordance with certain embodiments, for the absorber to capture a relatively high percentage of the energy from incident electromagnetic radiation. Capturing a relatively high percentage of the energy from incident electromagnetic energy can, in some embodiments, allow for a relatively high percentage of incident electromagnetic radiation to be converted into heat.

The absorptivity of a material, as a function of wavelength, can be measured using an ultraviolet/visible spectrophotometer. When using an ultraviolet/visible spectrophotometer to measure absorptivity, the absorptivity is weighted for the spectral power distribution of the light source. An exemplary light source is a halogen source with a color temperature of 3250 K in conjunction with an IR filter.

In some embodiments, the absorber has a minimum absorptivity for at least one wavelength within a band of wavelengths of electromagnetic radiation. In some embodiments, the absorber has an absorptivity of at least 50% with respect to at least one wavelength within a band of wavelengths of electromagnetic radiation. In some embodiments, the absorber has an absorptivity of at least 60%, at least 75%, at least 90%, at least 95%, at least 96%, at least 98%, at least 99%, at least 99.9%, or more with respect to at least one wavelength within a band of wavelengths of electromagnetic radiation. In some embodiments, the absorber has an absorptivity of at least 50%, at least 75%, at least 90%, at least 95%, at least 96%, at least 98%, at least 99%, at least 99.9%, or more with respect to at least 50%, at least 75%, at least 90%, at least 95%, at least 96%, at least 98%, at least 99%, at least 99.9%, or more of the wavelengths within a band of wavelengths of electromagnetic radiation. In some embodiments, the absorber has an absorptivity of at least 50%, at least 75%, at least 90%, at least 95%, at least 96%, at least 98%, at least 99%, at least 99.9%, or more with respect to all of the wavelengths within a band of wavelengths of electromagnetic radiation.

In some embodiments, the band of wavelengths of electromagnetic radiation to which the minimum absorptivities described above apply is the band from 200 nm to 1 µm. In some embodiments, the band of wavelengths is the band from 200 nm to 400 nm. In some embodiments, the band of wavelengths is the band from 400 nm to 800 nm. In some embodiments, the band of wavelengths is the band from 800 nm to 1000 nm.

Combinations of the above ranges are possible. For example, in some embodiments, the absorber has an absorptivity of at least 50% (or at least 75%, at least 90%, at least 95%, at least 96%, at least 98%, at least 99%, at least 99.9%, or more) with respect to at least one wavelength (or with respect to at least 50%, at least 75%, at least 90%, at least 95%, at least 96%, at least 98%, at least 99%, at least 99.9%, or more of the wavelengths) of electromagnetic radiation within the band wavelengths from 200 nm to 1 µm. In certain embodiments, the absorber has an absorptivity of at least 96% with respect to at least 50% of the wavelengths within the band of wavelengths from 400 nm to 800 nm. In certain embodiments, the absorber has an absorptivity of at least 96% with respect to all wavelengths within a range of from 400 nm to 800 nm.

In some embodiments, the absorber has a relatively high average absorptivity for a band of wavelengths. The average absorptivity, $\alpha_{\lambda_1,\lambda_2}$ for a band of wavelengths ranging from a first wavelength ($\lambda_1$) to a second wavelength ($\lambda_2$), can be expressed as follows:

$$\alpha_{\lambda_1,\lambda_2} = \frac{\int_{\lambda_1}^{\lambda_2} \alpha_\lambda d\lambda}{\lambda_2 - \lambda_1} \quad (1)$$

where $\alpha_\lambda$ is the wavelength-dependent absorptivity.

By measuring the absorptivity of the absorber as a function of wavelength (e.g., by acquiring an absorptivity spectrum) between $\lambda_1$ and $\lambda_2$, one can acquire $\alpha_{\lambda,0}$ experimentally and then use Equation (1) to calculate the average absorptivity, $\alpha_{\lambda_1,\lambda_2}$, for that band of wavelengths.

In some embodiments, the absorber has an average absorptivity of at least 50% for the band of wavelengths from 200 nm to 1 µm. In some embodiments, the absorber has an average absorptivity of at least 75%, at least 90%, at least 95%, at least 96%, at least 98%, at least 99%, at least 99.9%, or more for the band of wavelengths from 200 nm to 1 µm.

In some embodiments, the absorber has an average absorptivity of at least 50% (or at least 75%, at least 90%, at least 95%, at least 96%, at least 98%, at least 99%, at least 99.9%, or more) at a temperature of 25° C. for the band of wavelengths from 200 nm to 400 nm, from 400 nm to 800 nm, or from 800 nm to 1 µm. In certain embodiments, the absorber has an average absorptivity of 96% in the band of wavelengths from 400 nm to 800 nm.

Generally, the radiation, or emission, of energy from the surface of the absorber (e.g., in the form of thermal radiation, visible light, infrared radiation, etc.) is undesirable. However, such radiation/emission may occur (as is the case for any object at a temperature above absolute zero), and it is not required that such radiation/emission be completely eliminated. That is because, even if the absorber does emit/radiate energy, it may, in some embodiments, maintain enough energy in the form of heat to be an effective component of the photothermal trap. In other words, the absorber, in some embodiments, transfers a sufficient amount of heat to another region of the photothermal trap (e.g., the thermal spreader) even though the absorber is permitted to emit energy. For example, referring to FIG. 1A, in accordance with certain embodiments, absorber 110 of photothermal trap 100 may be permitted to emit energy from outer surface 112 as thermal radiation.

In some embodiments, the absorber has a relatively low emissivity. The emissivity of the surface of a material relates to its effectiveness in emitting energy as thermal radiation (e.g. as visible light, infrared radiation, etc.). Emissivity is expressed as the ratio of thermal radiation emitted from a surface to the thermal radiation emitted from the surface of an ideal black body as given by the Stefan-Boltzmann law, at a given wavelength and under the same viewing conditions. Because the emission spectrum of an ideal black body varies as a function of temperature, the emissivity of the surface of the material also varies as a function of temperature. Emissivity, like absorptivity, can be expressed as a percentage. The emissivity of a material can be measured, for example, using UV-visible spectroscopy.

In some embodiments, the absorber has a maximum emissivity for at least one wavelength within a band of wavelengths of electromagnetic radiation. In some embodiments, the absorber has an emissivity of less than or equal to 50% at a temperature of 25° C. with respect to at least one wavelength within a band of wavelengths of electromagnetic radiation. In some embodiments, the absorber has an emissivity of less than or equal to 25%, less than or equal to 10%, less than or equal to 5%, less than or equal to 3%, less than or equal to 2%, less than or equal to 1%, less than or equal to 0.5%, less than or equal to 0.1%, or less at a temperature of 25° C. with respect to at least one wavelength within a band of wavelengths of electromagnetic radiation. In some embodiments, the absorber has an emissivity of less than or equal to 50%, less than or equal to 25%, less than or equal to 10%, less than or equal to 5%, less than or equal to 3%, less than or equal to 2%, less than or equal to 1%, less than or equal to 0.5%, less than or equal to 0.1%, or less at a temperature of 25° C. with respect to at least 50%, at least 75%, at least 90%, at least 95%, at least 96%, at least 98%, at least 99%, at least 99.9%, or more of the wavelengths within a band of wavelengths of electromagnetic radiation. In some embodiments, the absorber has an emissivity of less than or equal to 50%, less than or equal to 25%, less than or equal to 10%, less than or equal to 5%, less than or equal to 3%, less than or equal to 2%, less than or equal to 1%, less than or equal to 0.5%, less than or equal to 0.1%, or less at a temperature of 25° C. with respect to all of the wavelengths within a band of wavelengths of electromagnetic radiation.

In some embodiments, the band of wavelengths of electromagnetic radiation to which the maximum emissivities described above apply is the band from 200 nm to 1 µm. In some embodiments, the band of wavelengths is the band from 200 nm to 400 nm. In some embodiments, the band of wavelengths is the band from 400 nm to 800 nm. In some embodiments, the band of wavelengths is the band from 800 nm to 1000 nm.

Combinations of the above ranges are possible. For example, in some embodiments, the absorber has an emissivity of less than or equal to 50% (or less than or equal to 25%, less than or equal to 10%, less than or equal to 5%, less than or equal to 3%, less than or equal to 2%, less than or equal to 1%, less than or equal to 0.5%, less than or equal to 0.1%, or less) at a temperature of 25° C. with respect to at least one wavelength (or with respect to at least at least 75%, at least 90%, at least 95%, at least 96%, at least 98%, at least 99%, at least 99.9%, or more of the wavelengths) of electromagnetic radiation within the band wavelengths from 200 nm to 1 μm. In certain embodiments, the absorber has an emissivity of less than or equal to 3% at a temperature of 25° C. for all wavelengths in the range of from 400 nm to 800 nm.

In some embodiments, the absorber can be configured to have a relatively high absorptivity and a relatively low emissivity with respect to at least one wavelength within a band of wavelengths of electromagnetic radiation. The high absorptivity, in some such embodiments, can enhance the degree to which the photothermal trap captures electromagnetic energy and converts it to heat. In addition, the low emissivity, in some such embodiments, can limit the amount of generated heat that is lost to radiation.

In some embodiments, the absorber has a maximum broadband emissivity for a band of wavelengths. The broadband emissivity, $\in_{\lambda_1,\lambda_2}$, for a band of wavelengths ranging from a first wavelength ($\lambda_1$) to a second wavelength ($\lambda_2$), at a temperature of T, can be expressed as follows:

$$\epsilon_{\lambda_1,\lambda_2} = \frac{\int_{\lambda_1}^{\lambda_2} \epsilon_\lambda B_\lambda(T) d\lambda}{\int_{\lambda_1}^{\lambda_2} B_\lambda(T) d\lambda} \quad (2)$$

where $\in_\lambda$ is the wavelength-dependent emissivity, given as the ratio of thermal energy ($E_\lambda$) emitted at a wavelength λ by a surface to that emitted by a blackbody (the Planck function, $B_\lambda(T)$) at that wavelength at a temperature T:

$$\epsilon_\lambda = \frac{E_\lambda}{B_\lambda(T)} \quad (3)$$

$$B_\lambda(T) = \frac{2hc^2}{\lambda^5} \frac{1}{e^{\frac{hc}{\lambda k_B T}} - 1} \quad (4)$$

where h is Planck's constant, c is the speed of light in the medium, and $k_B$ is Boltzmann's constant.

By measuring the emissivity of the absorber as a function of wavelength at a given temperature (e.g., by acquiring an emissivity spectrum) between $\lambda_1$ and $\lambda_2$, one can acquire $\in_\lambda$ experimentally and then use Equations (2), (3), and (4) to calculate the broadband emissivity, $\in_{\lambda_1,\lambda_2}$, for that band of wavelengths.

In some embodiments, the absorber has a broadband emissivity of less than or equal to 50% at a temperature of 25° C. for the band of wavelengths from 200 nm to 1 μm. In some embodiments, the absorber has a broadband emissivity of less than or equal to 25%, less than or equal to 10%, less than or equal to 5%, less than or equal to 3%, less than or equal to 2%, less than or equal to 1%, less than or equal to 0.5%, less than or equal to 0.1%, or less at a temperature of 25° C. for the band of wavelengths from 200 nm to 1 μm.

In some embodiments, the absorber has a broadband emissivity of less than or equal to 50% (or less than or equal to 25%, less than or equal to 10%, less than or equal to 5%, less than or equal to 3%, less than or equal to 2%, less than or equal to 1%, less than or equal to 0.5%, less than or equal to 0.1%, or less) at a temperature of 25° C. for the band of wavelengths from 200 nm to 400 nm, from 400 nm to 800 nm, or from 800 nm to 1 μm.

In some embodiments, the absorber of the photothermal trap has a certain minimum thickness. Having a certain minimum thickness may, in accordance with certain embodiments, be helpful in providing a long enough path length to allow the absorber to absorb a relatively high amount of incident electromagnetic radiation. In some embodiments, the absorber has a thickness of at least 100 nm. In some embodiments, the absorber has a thickness of at least 200 nm, at least 300 nm, at least 500 nm, at least 1 μm, at least 2 μm, at least 5 μm, at least 10 μm, or more.

In some embodiments, the absorber of the photothermal trap has a certain maximum thickness. Having a certain maximum thickness may be helpful, in accordance with certain embodiments, because if the absorber is too thick, the efficiency of heat transfer from the absorber to the thermal spreader could be diminished. In some embodiments, the absorber has a thickness of up to 100 μm. In some embodiments, the absorber has a thickness of up to 50 μm, up to 25 μm, up to 15 μm, or less. Combinations of these ranges with the minimum thickness ranges are also possible. For example, in some embodiments, the absorber has a thickness of at least 100 nm and up to 100 μm.

In some embodiments, the absorber occupies a domain of the photothermal trap. In some embodiments, the domain has a thickness as well as two orthogonal lateral dimensions that are orthogonal to each other as well as orthogonal to the thickness. For example, referring to FIG. 1A, in accordance with certain embodiments, absorber 110 occupies a domain of photothermal trap 100 that has thickness 161, lateral dimension 170, and a second lateral dimension (not pictured) orthogonal to both thickness 161 and lateral dimension 170 (which would run into and out of the plane of the drawing in FIG. 1A). In some embodiments, at least one of the lateral dimensions is at least 5 times, at least 10 times, at least 100 times, at least 1000 times, at least 10,000 times, at least 100,000 times, at least 1 million times, at least 10 million times, or at least 100 million times greater than the thickness. In some embodiments, both of the lateral dimensions of the domain the absorber occupies are at least 5 times, at least 10 times, at least 100 times, at least 1000 times, at least 10,000 times, at least 100,000 times, at least 1 million times, at least 10 million times, or at least 100 million times greater than the thickness of the absorber. In some embodiments, the absorber is in the form of a layer. For example, referring to FIG. 1A, in accordance with certain embodiments, absorber 110 is a layer included in photothermal trap 100.

As mentioned above, in some embodiments, the photothermal trap comprises a region that spreads heat. The spreading (or spatial transferring within the region) of heat in this region can occur via any number of processes, including, but not limited to, conduction, convection, and/or radiation. For example, referring to FIG. 1A, photothermal trap 100 comprises thermal spreader 120. In some embodiments, the region that spreads heat can be distinct from the region that absorbs electromagnetic radiation. For example, in some embodiments, the photothermal trap has a distinct absorber disposed over a distinct thermal spreader. Such an embodiment is illustrated in FIG. 1A, in the case where absorber 110 is distinct from thermal spreader 120. Generally, two regions or domains are distinct if they can be distinguished from each other spatially. In some embodiments where the absorber and the thermal spreader are two distinct regions of the photothermal trap, there is no spatial overlap between them. In embodiments in which the photothermal trap has a distinct absorber disposed over a distinct thermal spreader, the absorber can be a distinct domain or layer disposed over a distinct thermal spreader domain or layer. For example, referring to FIG. 1A, absorber 110 and thermal spreader 120 are, in accordance with certain embodiments, distinct layers. In some embodiments, the absorber is a layer of cermet coated or deposited on top of a layer of aluminum.

In other embodiments, the two regions (the region that absorbs electromagnetic radiation and the region that spreads heat) can be the same region. For example, the photothermal trap may, in accordance with certain embodiments, comprise a material that simultaneously possesses both the absorptivity and emissivity properties desired in an absorber as well as the thermal conductivity and thermal response times desired in a thermal spreader. In such an embodiment, absorber 110 and thermal spreader 120 would be the same material or a composite of multiple materials in the same region.

In accordance with certain embodiments, the thermal spreader distributes heat generated by the photothermal trap relatively uniformly across the lateral dimension of the photothermal trap. The thermal spreader, in some embodiments, accomplishes this by having a high thermal conductivity or effective thermal conductivity. Having a high thermal conductivity or effective thermal conductivity can allow heat transferred to one area of the thermal spreader (e.g. from the absorber after the absorber is exposed to electromagnetic radiation) to be efficiently and quickly spread to other areas of the thermal spreader. In some embodiments, the thermal spreader receives heat at a first area and spreads it to a second area. For example, referring to FIG. 1C, in certain embodiments of photothermal trap 100, the thermal spreader receives heat in an area under first area 152 and then spreads the heat to an area under second area 154. In some embodiments, the second area is a subset of the total area of the photothermal trap. In certain embodiments, the second area is the total area of the photothermal trap not including the first area. For example, referring to FIG. 1C, while second area 154 is shown as a subset of the total area of photothermal trap 100, in certain embodiments, it is the total area of photothermal trap 100 not including first area 152.

The thermal spreader of the photothermal trap is not limited to a single phase of matter. In some embodiments, the thermal spreader comprises both a solid and a liquid. For example, referring to FIG. 1A, thermal spreader 120 may comprise both a solid and a liquid. In some embodiments, the thermal spreader comprises a solid and a gas. In some embodiments, the thermal spreader comprises a solid, a liquid, and a gas. In some embodiments, at least 10 volume percent (vol %), at least 20 vol %, at least 30 vol %, at least 40 vol %, at least 50 vol %, at least 60 vol %, at least 70 vol %, at least 80 vol %, at least 90 vol %, at least 95 vol %, at least 99%, or more of the thermal spreader is made up of a solid. In some embodiments, at least 10 vol %, at least 20 vol %, at least 30 vol %, at least 40 vol %, at least 50 vol %, at least 60 vol %, at least 70 vol %, at least 80 vol %, at least 90 vol %, at least 95 vol %, at least 99%, or more of the thermal spreader is made up of a liquid. In some embodiments, at least 10 vol %, at least 20 vol %, at least 30 vol %, at least 40 vol %, at least 50 vol %, at least 60 vol %, at least 70 vol %, at least 80 vol %, at least 90 vol %, at least 95 vol %, at least 99%, or more of the thermal spreader is made up of a gas. Combinations of these ranges are possible. For example, according to one embodiment, 80 vol % of the thermal spreader is made up of a solid and 20 vol % is made up of a liquid. In another exemplary embodiment, 90 vol % of the thermal spreader is made up of a solid, 5 vol % is made up of a liquid, and 5 vol % is made up of a gas. In some embodiments, the entire thermal spreader is made up of a solid.

In some embodiments, the thermal spreader is or comprises a thermally conductive solid. An example of a thermally conductive solid is a metal such as aluminum. For example, thermal spreader 120 in FIG. 1A is, in some embodiments, a thermally conductive solid. Having a thermal spreader be a thermally conductive solid may allow, in accordance with certain embodiments, for the thermal spreader to efficiently spread heat while being simple and inexpensive to manufacture. In some embodiments in which the thermal spreader is predominantly a solid (e.g., when at least 90 vol % of the thermal spreader is a solid), thermal conductivity may the most dominant mechanism by which heat is transferred within the thermal spreader.

In some embodiments, the thermal spreader comprises a fluid. The fluid may be capable of spreading heat via convection, conduction, and/or the latent heat of phase transitions. Examples of such embodiments include those in which the thermal spreader is a heat pipe. Accordingly, referring to FIG. 1A, in some embodiments, thermal spreader 120 is a heat pipe. A heat pipe, in accordance with certain embodiments, comprises a hollow container made of a thermally conductive material, inside of which is a fluid that transfers heat from one portion of the heat pipe to another via convection, conduction, and/or the latent heat of phase transitions. For example, the transfer of heat to the surface of one portion of the heat pipe may cause liquid inside the heat pipe that is proximate to the heated region to evaporate into a vapor. The vapor may diffuse, travel via convection, or conduct heat to other vapor, until vapor reaches a portion of the heat pipe where the surface of the heat pipe is cooler, such that the vapor condenses, at which point the latent heat released by the condensation heats up the cooler portion of the heat pipe, thus transferring heat from one part of the heat pipe to another. In some embodiments, the fluid flows through a flow channel of the heat pipe.

Thermal conductivity is understood to be an intrinsic property of a material related to its ability to conduct heat. Thermal conductivity is a temperature-dependent quantity and is typically reported in units of W m$^{-1}$ K$^{-1}$. The thermal conductivities of many materials have been measured and are widely available in databases of material properties. An exemplary method for measuring thermal conductivity is described in ASTM Standard Test E1225.

In accordance with certain embodiments, the thermal spreader has a certain minimum thermal conductivity in a lateral direction. For example, referring to FIG. 1A, in accordance with certain embodiments, thermal spreader 120 of photothermal trap 100 has a thickness 162 and a lateral direction perpendicular to the thickness. In some such embodiments, thermal spreader 120 has a certain minimum thermal conductivity in the lateral dimension. In some embodiments, the thermal spreader is configured to have a thermal conductivity in the lateral direction of at least 50 W m$^{-1}$ K$^{-1}$ at 25° C. Having a high enough thermal conductivity can, in some embodiments, allow the thermal spreader to be assumed to be at a relatively uniform temperature. In some embodiments, the thermal spreader is configured to have a thermal conductivity in the lateral direction of at least 70 W m⁻¹ K⁻¹, at least 80 W m⁻¹ K⁻¹, at least 90 W m⁻¹ K⁻¹, at least 100 W m⁻¹ K⁻¹ or more at 25° C. In some embodiments, the thermal spreader is configured to have a thermal conductivity in the lateral direction of up to 10000 W m⁻¹ K⁻¹ at 25° C. In some embodiments, the thermal spreader is configured to have a thermal conductivity in the lateral direction of up to 2500 W m⁻¹ K⁻¹, of up to 1500 W m⁻¹ K⁻¹, of up to 1000 W m⁻¹ K⁻¹, of up to 500 W m⁻¹ K⁻¹, or less at 25° C. Combinations of the above ranges are possible. For example, in some embodiments, the thermal spreader is configured to have a thermal conductivity in the lateral direction of at least 50 W m⁻¹ K⁻¹ and up to 5000 W m⁻¹ K⁻¹ at 25° C. In some embodiments, the thermal spreader has a thermal conductivity of about 225 W m⁻¹ K⁻¹ at 25° C.

In some embodiments where the thermal spreader has a relatively high thermal conductivity, the thermal spreader can be, predominantly, a solid material (e.g., at least 90 vol %, at least 95 vol %, at least 99 vol %, at least 99.9 vol % or more solid).

In some embodiments, the thermal spreader has a relatively high thermal conductance in a lateral direction. A lateral direction for the thermal spreader is a direction orthogonal to its thickness. For example, referring to FIG. 1A, thermal spreader 120 has a thickness 162 and a lateral direction parallel to lateral dimension 170 that is orthogonal to thickness 162. In accordance with certain embodiments, thermal spreader 120 has a relatively high thermal conductance in the lateral direction parallel to lateral dimension 170. Thermal conductance generally relates to the quantity of heat that passes in unit time through a material of particular area and length, where the opposite ends of the length through which the heat travels differ in temperature by 1 kelvin. Thermal conductance can be expressed as $$\frac{kA}{L},$$

where k is the thermal conductivity of the material, A is the cross-sectional area through which the heat is transferred, L is the length across which the heat is transferred. When expressed this way, thermal conductance has units of W K⁻¹. With respect to thermal conductance in the lateral direction of the thermal spreader, the cross-sectional area A depends on the thickness of the thermal spreader and L depends on the lateral dimension of the thermal spreader. For example, referring to FIG. 1A, in accordance with certain embodiments, a cross-sectional area A of thermal spreader 120 is the product of thickness dimension 162 and lateral dimension 170.

In some embodiments, the thermal spreader of the photothermal trap has a certain minimum thermal conductance in a lateral direction, so as to allow for efficient transfer of heat in the lateral direction. In some embodiments, the thermal trap has a thermal conductance of at least 0.001 W K⁻¹, at least 0.01 W K⁻¹, at least 0.1 W K⁻¹, at least 1 W K⁻¹, at least 10 W K⁻¹, at least 100 W K⁻¹, at least 1000 W K⁻¹, and/or up to 10,000 W K⁻¹ or more across a lateral distance of at least 100 times, at least 1000 times, at least 10,000 times, at least 100,000 times, and/or up to 1 million times or more the thickness of the thermal spreader.

In some embodiments, the thermal spreader has a certain minimum thermal transfer rate in the lateral direction. Generally, the thermal transfer rate of an object relates to the rate at which heat transfers between two points separated by particular distance in the object, with each of the points being at a different temperature. The thermal transfer rate accounts for all forms of heat transfer, including conduction, convection, phase changes, etc. The thermal transfer rate can be measured by, for example, applying the ASTM E459 standard test.

In some embodiments, the thermal spreader is able to achieve relatively high thermal transfer rates. In some embodiments, there is a thermal transfer rate of at least 0.1 W in the thermal spreader separated in a lateral direction by a distance of at least 100 times, at least 1,000 times, at least 10,000 times, at least 100,000 times and or up to 1 million times the thickness of the thermal spreader between a first and second locations, the first and second locations having a difference in temperature of 1 Kelvin.

In some embodiments where the thermal spreader is able to achieve a relatively high thermal transfer rate, the thermal spreader achieves the high thermal transfer rate by incorporating a flow channel (e.g., a heat pipe). In some embodiments, the thermal spreader comprises a fluid in the flow channel.

In some embodiments, the photothermal trap has a relatively low thermal response time constant. The thermal response time constant of a material relates how quickly the temperature of a material approaches that of its surroundings. Having a low thermal response time constant allows, in accordance with certain embodiments, for the temperature of a material to change quickly. The temperature of a thermal spreader with a relatively low thermal response time constant can, in some embodiments, rapidly raise when heat is transferred to it (e.g., from an absorber). In some embodiments, the rapid rise in temperature associated with a relatively low thermal response time constant helps induce a phase transfer (e.g., melt ice) faster. The thermal response time constant, τ, can be expressed as:

$$\tau = \frac{\rho C_p \delta}{h} \quad (5)$$

where ρ is the density (mass/volume) of the material, $C_p$ is the specific heat capacity of the material, δ is the thickness of the material, and h is the heat transfer coefficient of the material.

In some embodiments, the photothermal trap is configured to have a relatively short thermal response time constant, so as to ensure that the surface of the photothermal trap is heated at a fast enough rate to induce or inhibit the phase change of a material in a timely manner. In some embodiments, the thermal response time constant of the photothermal trap is less than or equal to 800 seconds. In some embodiments, the thermal response time constant of the photothermal trap is less than or equal to 300 seconds, less than or equal to 100 seconds, less than or equal to 80 seconds, or less. In some embodiments, the thermal response time of the photothermal trap is at least 1 second. In some embodiments, the thermal response time of the photothermal trap is at least 5 seconds, at least 10 seconds, at least 20 seconds or more. Combinations of these ranges are possible. For example, in some embodiments the thermal response time constant of the photothermal trap is in the range of from 1 second to 800 seconds.

In some embodiments, the thermal spreader of the photothermal trap has a certain minimum thickness. Having a certain minimum thickness can, in certain embodiments allow for the thermal spreader to efficiently transfer heat in a lateral direction. For example, in some cases, if the thermal spreader is too thin, the thermal conductance in the lateral direction may be too small to efficiently transfer heat laterally. In some embodiments, the thermal spreader has a thickness of at least 1 µm. In some embodiments, the thermal spreader has a thickness of at least 2 µm, at least 5 µm, at least 10 µm, at least 50 µm, at least 100 µm, at least 200 µm, or more.

In some embodiments, the thermal spreader of the photothermal trap has a certain maximum thickness. Having a certain maximum thickness can, in certain embodiments, allow for the thermal spreader to avoid having too high a thermal response time constant. In some embodiments, the thermal spreader has a thickness of up to 5 mm. In some embodiments, the thermal spreader has a thickness of up to 2.5 mm, up to 1 mm, up to 500 µm, up to 2.5 µm or less. Combinations of these ranges with the minimum thickness ranges are also possible. For example, in some embodiments, the thermal spreader has a thickness of at least 1 µm and up to 5 mm.

In some embodiments, the thermal spreader occupies a domain of the photothermal trap. In some embodiments, the domain has a thickness as well as two orthogonal lateral dimensions that are also orthogonal to the thickness. For example, referring to FIG. 1A, in accordance with certain embodiments, thermal spreader 120 occupies a domain of photothermal trap 100 that has thickness 162, lateral dimension 170, and a second lateral dimension (not pictured) orthogonal to both thickness 162 and lateral dimension 170. In some embodiments, at least one of the lateral dimensions of the domain occupied by the thermal spreader is at least as great as the thickness. In some embodiments, at least one of the lateral dimensions is at least 5 times, at least 10 times, at least 100 times, at least 1000 times, at least 10,000 times, at least 100,000 times, at least 1 million times, or at least 10 million times greater than the thickness. In some embodiments, both of the lateral dimensions of the domain the thermal spreader occupies are at least 5 times, at least 10 times, at least 100 times, at least 1000 times, at least 10,000 times, at least 100,000 times, at least 1 million times, or at least 10 million times greater than the thickness of the thermal spreader. In some embodiments, both of the lateral dimensions of the domain the thermal spreader occupies are at least 5 times, at least 10 times, at least 100 times, at least 1000 times, at least 10,000 times, at least 100,000 times, at least 1 million times, or at least 10 million times greater than the thickness of the absorber. In some embodiments, the thermal spreader is in the form of a layer. For example, referring to FIG. 1A, in accordance with certain embodiments, thermal spreader 120 is a layer included in photothermal trap 100.

In some embodiments, the thermal spreader is capable of spreading heat laterally from a first location to a second location that is relatively far away from the first location. For example, referring to FIG. 1C, in accordance with certain embodiments, heat transferred into thermal spreader 120 at an area under first area 152 is capable of transferring laterally thermal spreader 120 to an area under second area 154, wherein second area 154 is located relatively far away from first area 152. In some embodiments, the first location (from which the heat spreads) is a distance from the second portion of at least 10 times (at least 100 times, at least 1000 times, and/or up to 10,000 times, up to 100,000 times, up to 1 million times, or more) the thickness of the thermal spreader. In some embodiments, the first location is a distance from the second portion of at least 10 times (at least 100 times, at least 1000 times, and/or up to 10,000 times, up to 100,000 times, up to 1 million times, or more) the thickness of the absorber. In some embodiments, the first location is a distance from the second portion of at least 10 times (at least 100 times, at least 1000 times, and/or up to 10,000 times, up to 100,000 times, up to 1 million times, or more) the thickness of the combined thickness of the thermal spreader and the absorber. The spreading of heat from a first location to a second location can be determined by detecting a thermally-induced phase change of a material from a lower-energy phase to a higher-energy phase, wherein the material is disposed over the second location, the second location receives a flux of electromagnetic radiation in the band of wavelengths of 200 nm to 1 µm that is less than or equal to 1% of that received by the first location, and the ambient temperature is below the phase change temperature corresponding to the lower-energy and higher-energy phases of the material.

As mentioned above, in some embodiments, the photothermal trap comprises a thermally insulating region under the thermal spreader. In some embodiments, the photothermal trap comprises a domain under the thermal spreader that is a thermal insulator. For example, referring to FIG. 1B, photothermal trap 100 comprises thermal insulator 130 under thermal spreader 120.

The thermal insulator, in some embodiments, limits the spread or transfer of heat in the thickness direction of the photothermal trap such that heat generated by the absorption of electromagnetic radiation is kept near the surface of the photothermal trap and spread primarily laterally. For example, referring to FIG. 1C, in accordance with certain embodiments, when photothermal trap 100 is exposed to electromagnetic radiation at first area 152 and converts it to heat, the heat may be transferred in the thickness (e.g. the transverse) direction to the thermal spreader 120 as well as laterally, but the presence of thermal insulator 130 thermally limits the further spread of heat in the thickness direction.

Generally, the thermal insulator, when present, limits the transfer of heat because it has a low thermal conductivity. In some embodiments, the thermal insulator has a thermal conductivity in a transverse direction of less than or equal to 1 W m$^{-1}$ K$^{-1}$ at 25° C. In some embodiments, the thermal insulator has a thermal conductivity in a transverse direction of less than or equal to 0.5 W m$^{-1}$ K$^{-1}$, less than 0.1 W m$^{-1}$ K$^{-1}$, less than or equal to 0.05 W m$^{-1}$ K$^{-1}$, less than or equal to 0.01 W m$^{-1}$ K$^{-1}$, or less at 25° C.

The thermal insulator may, in some embodiments, have a certain minimum R-value. The R-value of the material, which has SI units of m$^2$ K W$^{-1}$, is a standardized measure of how well an object, such as a layer of material, resists conductive flow of heat. The R-value of an object can be expressed as follows:

$$R = \frac{\delta}{k} \quad (6)$$

where R is the R-value, k is the thermal conductivity of the object and $\delta$ is its thickness. The higher the R-value of an object, the better a thermal insulator it will be. Note that R-values are dependent on the thickness of an object. Therefore, thicker thermal insulators made from a given material will have higher R-values. As can be seen from equation (6), the R-value of an object can be determined by dividing its thickness by its thermal conductivity. In some embodiments, the thermal insulator has an R-value of at least 0.0001, at least 0.001, at least 0.01, at least 0.02, at least 0.05, at least 0.1, at least 0.2, at least 0.5, at least 1, at least 5, at least 10, at least 50, at least 100 m² K W⁻¹, or more. In some embodiments, the thermal insulator has an R-value of up to 1000 m² K W⁻¹, up to 800 m² K W⁻¹ up to 500 m² K W⁻¹ or less.

In some embodiments, the thermal insulator is a component of the photothermal trap before the photothermal trap has been positioned for use. For example, the photothermal trap may be a distinct layer of the photothermal trap such as a layer of foam upon which the absorber and thermal spreader are disposed. For example, referring to FIG. 1B, in accordance with certain embodiments, photothermal trap 100 comprises absorber 110 as a layer over thermal spreader 120, under which is a layer comprising thermal insulator 130. The photothermal trap comprising an absorber layer, a thermal spreader layer, and optionally a thermal insulator can, in some embodiments, form a laminate that is or can be placed over (e.g., applied directly on to) a separate surface (e.g., an airplane wing). In some embodiments, the photothermal trap comprising an absorber layer, thermal spreader layer, and optionally a thermal insulator forms a panel that is or can be placed over a separate surface. In such embodiments, the laminate and/or panel can either be directly in contact with the separate surface, or it could be placed over the surface without being in direct contact (e.g. the panel can, in some embodiments, be elevated above the separate surface).

Examples of separate surfaces to which the photothermal trap can be applied include, but are not limited to, an airplane surface (e.g., an airplane wing, an airplane hull), a wind turbine surface (e.g., a wind turbine blade), a power line surface, a building surface (e.g., building siding and/or rooftop), a condenser surface, and/or an offshore platform surface.

In some embodiments, the thermal insulator or thermally insulating region is the surface or substrate on which the other components of the photothermal trap (e.g., the absorber and the thermal spreader), are placed. For example, referring to FIG. 1B, in accordance with certain embodiments, photothermal trap 100 comprises thermal insulator 130, where thermal insulator 130 is a thermally insulating substrate, and absorber 110 and thermal spreader 120 are coated on top of thermal insulator 130 to form photothermal trap 100. As another example, in embodiments (e.g., in which an outdoor surface is to be deiced), if the outdoor surface is sufficiently thermally insulating, it can be the insulating layer of the photothermal trap. In such embodiments, the absorber and thermal spreader can be applied directly to the outdoor surface.

As mentioned above, the photothermal trap, in some embodiments, further comprises a material disposed over the absorber. The material over the absorber may, in accordance with certain embodiments, be a block or sheet of ice, a pool of water or water droplets, or some other material for which the user may desire to induce or inhibit a phase change (also referred to herein as a phase change material). In some embodiments, the material disposed over the absorber undergoes a phase change in the temperature range of from −20° C. to 50° C. For example, referring to FIG. 1A, photothermal trap 100, in accordance with certain embodiments, further comprises a material disposed over absorber 110. The material over absorber 110, in some embodiments, undergoes a phase change in the temperature range of −20° C. to 50° C.

In some embodiments, the material disposed over the absorber is proximate to photothermal trap. For example, referring to FIG. 1A, photothermal trap 100, in accordance with certain embodiments, further comprises a material proximate to absorber 110. In some embodiments, the distance between the material proximate to the photothermal trap and the surface of the photothermal trap is less than or equal to 100 thicknesses of the combined absorber and thermal spreader. In some embodiments, the distance between the material proximate to the photothermal trap and the surface of the photothermal trap is less than or equal to 50 thicknesses, less than or equal to 25 thicknesses, less than or equal to 10 thicknesses, less than or equal to 5 thicknesses, less than or equal to 3 thicknesses, or less than or equal to 1 thickness of the combined absorber and thermal spreader. In some embodiments, the material proximate the photothermal trap is in contact with the photothermal trap. In some embodiments, the material proximate the photothermal trap is a phase change material.

In some embodiments, the photothermal trap comprises a phase change material over an area that is heated due to the transfer of heat generated at a different area of the photothermal trap. In some embodiments, the flux of electromagnetic radiation at the area over which phase change material sits may be less than the flux at a different area of the photothermal trap. For example, the phase change material may be sitting in a shadowed area such that phase change material in the area under it is not appreciably exposed to sunlight or other forms of illumination. In such embodiments, other areas the photothermal trap exposed to a higher flux of electromagnetic radiation can generate heat that is spread to the area over which the phase change material is sitting, inducing or inhibiting a phase change in the phase change material. For example, referring to FIG. 1C, first area 152 may, in accordance with certain embodiments, experience a higher flux of electromagnetic radiation than second area 154, and a phase change material may be sitting over second area 154. Despite the difference in fluxes of electromagnetic radiation at the two areas, the temperature, in some embodiments, may still rise to a high enough extent at second area 154 to induce or inhibit the change a phase in the phase change material.

In some embodiments, a phase change may be inhibited or induced at a location that is relatively far away from the area that is exposed to electromagnetic radiation. For example, in some embodiments, a first portion of the photothermal trap is exposed to electromagnetic radiation, and a phase change is inhibited or induced at a second portion of the photothermal trap, wherein the distance between the first portion and the second portion is at least 10 times (at least 100 times, at least 1000 times, and/or up to 10,000 times, up to 100,000 times, up to 1 million times, or more) the thickness of the thermal spreader. In some embodiments, a first portion of the photothermal trap is exposed to electromagnetic radiation, and a phase change is inhibited or induced at a second portion of the photothermal trap, wherein the distance between the first portion and the second portion is at least 10 times (or at least 100 times, at least 1000 times, at least 10,000 times, at least 100,000 times, at least 1 million times, at least 10 million times, at least 100 million times, and/or up to 1 billion times or more) the thickness of the absorber. In some embodiments, a first portion of the photothermal trap is exposed to electromagnetic radiation, and a phase change is inhibited or induced at a second portion of the photothermal trap, wherein the distance between the first portion and the second portion is at least 10 times (at least 100 times, at least 1000 times, and/or up to 10,000 times, up to 100,000 times, up to 1 million times, or more) the combined thicknesses of the absorber and the thermal spreader.

In some embodiments, the phase change material is ice or water. In some embodiments, phase change material is a different material that changes phase in the temperature range of −20° C. to 50° C. For example, the phase change material is, in some embodiments, a wax that melts in the temperature range of −20° C. to 50° C. In some embodiments, the phase change material is a metal or metal alloy capable of melting into a liquid in the temperature range of −20° C. to 50° C.

As noted elsewhere, in some embodiments, the photothermal trap induces or inhibits a phase change of a material, or is configured to do so. In certain embodiments, the photothermal trap induces a phase change from a lower energy phase to a higher energy phase. Those of ordinary skill in the art would understand the meaning of "lower energy phase" and "higher energy phase" in the context in which those phrases are used herein. For example, a liquid phase is a lower energy phased in a gaseous phase, by virtue of the fact that the molecules in the gaseous phase have a higher amount of energy that the molecules in the liquid phase. Similarly, a solid phase is a lower energy phase than a liquid phase. Similarly, a gaseous phase is a higher energy phase than a liquid phase, and a liquid phase is a higher energy phased than a solid phase. In some embodiments, the photothermal trap induces a phase change of a substance from a solid to a liquid, from a liquid to a gas, and/or from a solid to a gas.

In certain embodiments, the photothermal trap inhibits (or prevents) a phase change from a higher energy phase to a lower energy phase. In some embodiments, the photothermal trap inhibits (or prevents) a phase change of a substance from a gas to a liquid, from a liquid to a solid, and/or from a gas to a solid.

In some embodiments, the photothermal trap facilitates the removal of objects from a surface. Some embodiments, the spread of heat generated by the absorption of the electromagnetic radiation causes a rise in temperature new the surface of the photothermal trap that melts a portion of the object at the interface between the object and the photothermal trap into a lubricating layer. The lubricating layer, in some embodiments, reduces the friction between the object in the photothermal trap such that the object slides off the photothermal trap due to the force of gravity or an applied force (e.g., an applied mechanical force). For example, in accordance with certain embodiments, ice sitting on top of photothermal trap 100 can be partially melted when absorber 110 converts incident alleged minute radiation into heat such that a lubricating layer is formed between the ice and outer surface 112. The partially melted ice in this embodiment can easily slide off the photothermal trap 100.

Figure 2A:
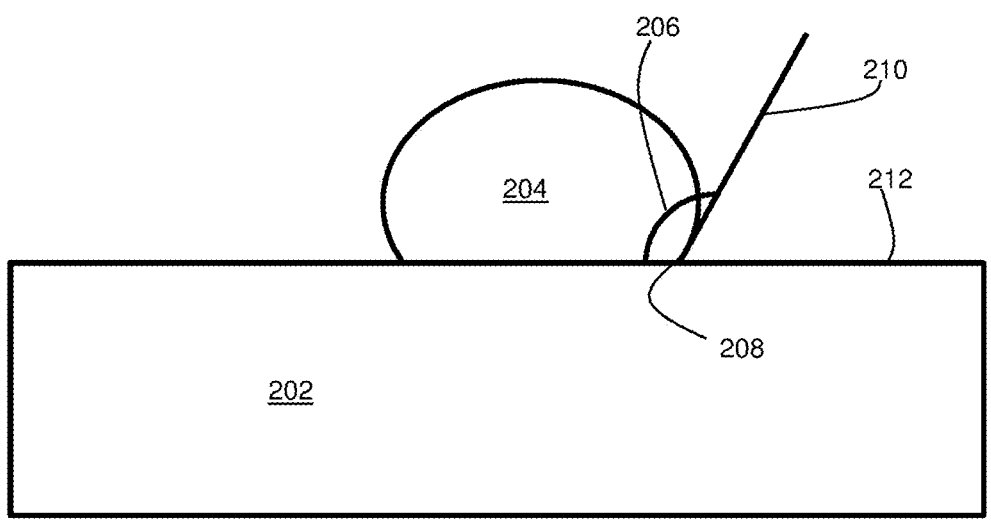
FIG. 2A is an exemplary cross-sectional schematic diagram illustrating the interaction of a liquid droplet with a surface when the surface is non-wetting with respect to the liquid.
Figure 2B:
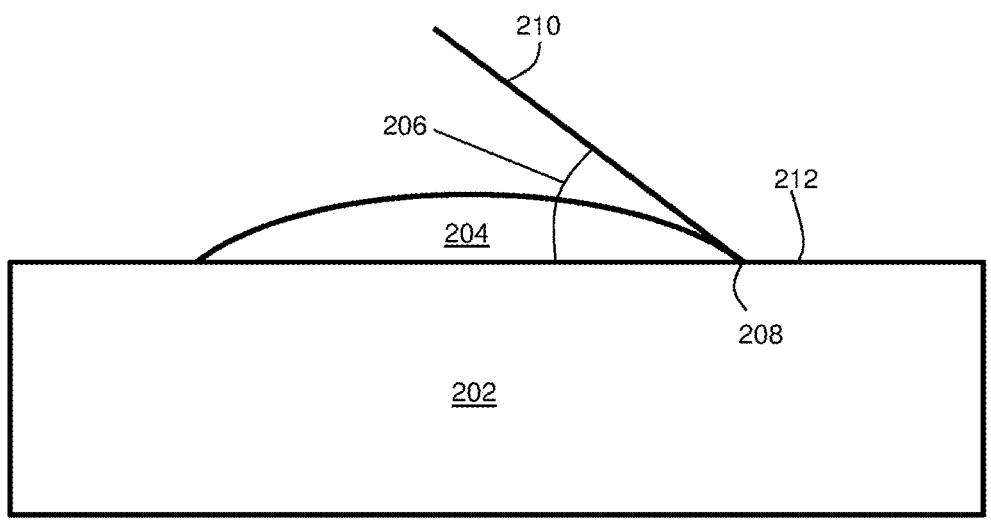
FIG. 2B is an exemplary cross-sectional schematic diagram illustrating the interaction of a liquid droplet with a surface when the surface is wetting with respect to the liquid.

In some embodiments, the photothermal trap comprises a hydrophobic surface on or over the region that absorbs electromagnetic radiation (e.g., the absorber). A surface is said to be hydrophobic when that surface is non-wetting with respect to liquid water. As used herein, a surface is considered to be non-wetting with respect to a liquid when, if a droplet of the liquid is positioned on the surface in a gaseous environment at the temperature and pressure at which the liquid and surface are being used, the droplet forms a contact angle, as measured through the bulk of the droplet, of greater than 90°. FIG. 2A shows an exemplary cross-sectional schematic diagram illustrating the interaction of liquid droplet 204 with surface 212 of substrate 202 when the surface is non-wetting with respect to the liquid. As shown in FIG. 2A, contact angle 206 is measured between (1) line 210 drawn tangent to the exterior surface of droplet 204 at point of contact 208 with substrate surface 212 and (2) substrate surface 212. Contact angle 206 is measured through the bulk of droplet 204. In FIG. 2A, contact angle 206 is greater than 90° (e.g., about 120°). This indicates that substrate surface 212 is non-wetting with respect to droplet 204 of the liquid. Conversely, FIG. 2B shows an exemplary cross-sectional schematic diagram illustrating the interaction of a liquid droplet with a surface when the surface is wetting with respect to the liquid. Contact angle 206 between droplet 204 of the liquid on substrate surface 212 is less than 90° (e.g., about 50° in FIG. 2B), indicating that substrate surface 212 is wetting with respect to droplet 204 of the liquid. According to certain embodiments, the contact angle between the hydrophobic surface of the photothermal trap and water is greater than 100°, greater than 105°, greater than 110°, greater than 120°, greater than 130°, greater than 140°, greater than 150°, greater than 160°, or greater than 170°. In some embodiments, the contact angle between the hydrophobic surface of the photothermal trap and water is less than 179°.

The contact angle between the hydrophobic surface of the photothermal trap and water can fall within any of the ranges outlined above, for example, when the droplet of the water and the hydrophobic surface are present at conditions at which the method is performed (e.g., during use). According to certain embodiments, the hydrophobic surface of the photothermal trap is hydrophobic at a temperature of 25° C. and at a pressure of 1 atmosphere when in an air environment.

In some embodiments, the hydrophobic surface over the absorber is a coating of hydrophobic material. For example, referring to FIG. 1B, in photothermal trap 100, hydrophobic region 140 comprising hydrophobic surface 142 is, in accordance certain embodiments, coated over absorber 110. An example of a hydrophobic material that can be coated over the absorber is polytetrafluoroethylene (PTFE).

In some embodiments, the hydrophobic surface is part of the absorber. For example, referring to FIG. 1A, the hydrophobic surface is, in accordance with certain embodiments, outer surface 112 of absorber 110. The outer surface of the absorber can be made to be hydrophobic, in some embodiments by patterning or otherwise texturing the surface. Examples of fabricating surfaces that can be tailored to be hydrophobic (and, in some cases, superhydrophobic) are described, for example, in International Patent Application Publication No. WO 2013/022467, filed Nov. 22, 2011 as International Patent Application No. PCT/US2011/061898; International Patent Application Publication No. WO 2013/141888, filed Jun. 13, 2012 as International Patent Application No. PCT/US2012/042326; and International Patent Application Publication No. WO 2014/078867, filed Nov. 19, 2013 as International Patent Application No. PCT/US2013/070827, each of which is incorporated herein by reference in its entirety.

The absorber of the photothermal trap can be made from a variety of materials possessing high absorptivity. Non-limiting examples of such materials include ceramic-metal composites (cermets), carbon black (e.g., carbon black paint), tedlar black plastic, nickel-plated anodized aluminum or steel, black chromium, and/or cupric oxide.

The thermal spreader of the photothermal trap can be made from a variety of materials possessing a high thermal conductivity and/or effective thermal conductivity. In some embodiments, the thermal spreader comprises a thermally conductive solid material. Examples of thermally conductive solid materials that may be used include, but are not limited to metals (e.g., aluminum, copper, titanium, chromium, iron, nickel, zinc), combinations of metals (e.g., alloys), carbon (e.g., carbon nanotubes, graphite, graphene, and/or composites thereof), and/or combinations thereof. In some embodiments, a relatively high percentage of the volume of the thermal spreader is made up of the solid, thermally conductive material. For example, in some embodiments, at least 50 vol %, at least 75 vol %, at least 90 vol %, at least 95 vol %, at least 99 vol %, or more of the thermal spreader is made up of solid, thermally conductive material. In some embodiments, the thermal spreader is a metal or metal alloy.

In embodiments in which the thermal spreader is a heat pipe, the heat pipe can be made from a variety of suitable materials. Exemplary, non-limiting materials that can be used to fabricate the heat pipe include, but are not limited to, copper, aluminum, or other thermally conductive solids for the solid portion (or combinations thereof), and water, ammonia, ethanol, methanol, or other suitable fluids (or combinations thereof) for the fluid portion.

The thermal insulator of the photothermal trap (when present) can be made from a variety of materials possessing a low thermal conductivity and/or a high R-value. Non-limiting examples of such materials include, but are not limited to, polymers, foams (e.g., polystyrene, ethyl vinyl acetate, polyurethane, polyisocyanurate, polyethylene, cellulose, etc.), glasses, ceramics, vacuum insulation, clays, and/or combinations thereof. In some embodiments, the material may be in the form of a foam. In some embodiments, the material may be in the form of a composite.

The hydrophobic surface of the photothermal trap (when present) can be made from a variety of materials or patterning methods. For example, the photothermal trap could, in some embodiments, be coated with PTFE or other fluorocarbons, fluorinated silanes, siloxanes, nanocomposites of manganese oxides with polystyrene, and/or combinations thereof. In embodiments in which the hydrophobic surface is formed via patterning, the patterning can be formed by any of the methods described in the relevant references incorporated herein above. Additionally, one way to create a hydrophobic surface via patterning is creating a nanotextured surface and optionally impregnating the textured surface with lubricant, as described in Anand, S., Paxson, A. T., Dhiman, R., Smith, J. D., & Varanasi, K. K. (2012). Enhanced condensation on lubricant-impregnated nanotextured surfaces. ACS nano, 6(11), 10122-10129, which is incorporated herein by reference in its entirety. Another method for creating a hydrophobic surface via patterning is by using laser ablation, as described in Azimi, G., Kwon, H. M., & Varanasi, K. K. (2014). Superhydrophobic surfaces by laser ablation of rare-earth oxide ceramics. MRS Communications, 4(3), 95-99, which is incorporated herein by reference in its entirety.

Individual components of the photothermal trap can be assembled to form the photothermal trap using a variety of methods. Examples of such methods include depositing of the absorber material on to the thermal spreader material (e.g., via sputtering, pulsed laser deposition, vacuum thermal evaporation, atomic layer deposition, chemical vapor deposition, electrodeposition, etc.), coating the absorber material on to the thermal spreader (e.g., spin-coating, drop-casting, etc.), or mechanically applying and/or adhering the absorber material on to the thermal spreader. Additional steps may, in some embodiments, be required, such as annealing, anodizing, etc. Similar techniques can, in some embodiments, be used for assembling optional regions such as hydrophobic regions or thermal insulators.

It should be understood that when a structure is referred to as being "on", "over", "under", "on top of", or "underneath", another structure, these terms are used to indicate relative positioning of the structures, and that the terms are meant to be used in such a way that the relative positioning of the structures is independent of the orientation of the combined structures or the vantage point of an observer. Additionally, it should also be understood that when a structure is referred to as being "on" or "over" another structure, it may cover the entire structure, or a portion of the structure. Similarly, it should be understood that when a structure is referred to as being "under" another structure, it may be covered by the entire structure, or a portion of the structure.

In addition, when a first structure is referred to as being "on," "over," or "on top of" a second structure, the first structure can be directly on the second structure, or an intervening structure (e.g., a layer, a gap) also may be present between the first structure and the second structure. Similarly, when a first structure is "under" or "underneath" a second structure, the first structure can be directly under the second structure, or an intervening structure (e.g., a layer, a gap) also may be present between the first structure and the second structure. A first structure that is "directly on," "directly under," or "in direct contact with" a second structure means that no intervening structure is present between the first structure and the second structure.

U.S. Provisional Application No. 62/659,955, filed Apr. 19, 2018, and entitled "Photothermal Trap for Ice Mitigation" is incorporated herein by reference in its entirety for all purposes. U.S. Provisional Application No. 62/711,343, filed Jul. 27, 2018, and entitled "Photothermal Trap" is also incorporated herein by reference in its entirety for all purposes.

The following examples are intended to illustrate certain embodiments of the present invention, but do not exemplify the full scope of the invention.

Example 1

This example describes further experimentation, embodiments, and non-limiting theories regarding the mechanisms and parameters guiding deicing of surfaces by the photothermal trap. The materials and parameter values described in this example are non-limiting and by way of example, only.

This example describes the fabrication and use of an exemplary photothermal trap. As shown in the schematic illustration of FIG. 3A, the photothermal trap was made of three layers: an absorber, a thermal spreader, and a thermal insulator. The effectiveness of such a trap to deice was characterized by the maximum increase in the surface temperature under illumination and the thermal response time scale. These two factors were tuned by the design of the photothermal trap. First, the photothermal trap was designed to effectively absorb the incident energy. Second, the photothermal trap was designed to spread the heat laterally while localizing it at or near the surface (as opposed to within the bulk). Third, the photothermal trap was designed to have a fast thermal response time so that ice melting and removal was faster than ice buildup, thus preventing ice accumulation. Lateral spreading is generally important because often illumination is inhomogeneous due to shadowing of certain surface areas by clouds, objects, or local ice formations, or in cases where solar radiation is insufficient and has to be augmented by a focused external light source. The photothermal trap in this example was designed to be adhered or coated onto an exposed surface (e.g. a base substrate) to facilitate deicing of the surface (FIG. 3A) and was realized using commercially available materials.

Figure 3A:
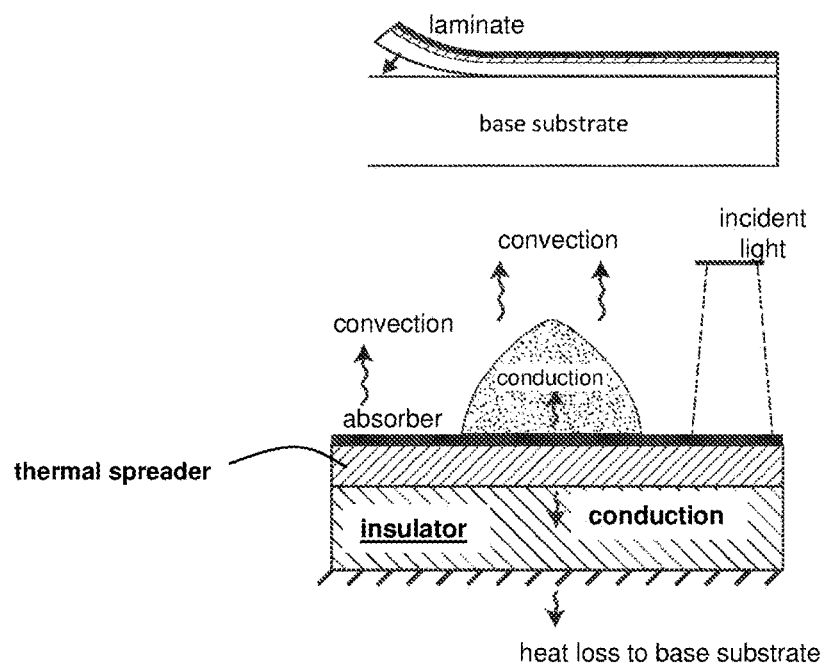
FIG. 3A shows a schematic of a photothermal trap applied as a laminate on a base substrate and the associated heat transfer mechanisms, according to some embodiments.
Figure 3B:
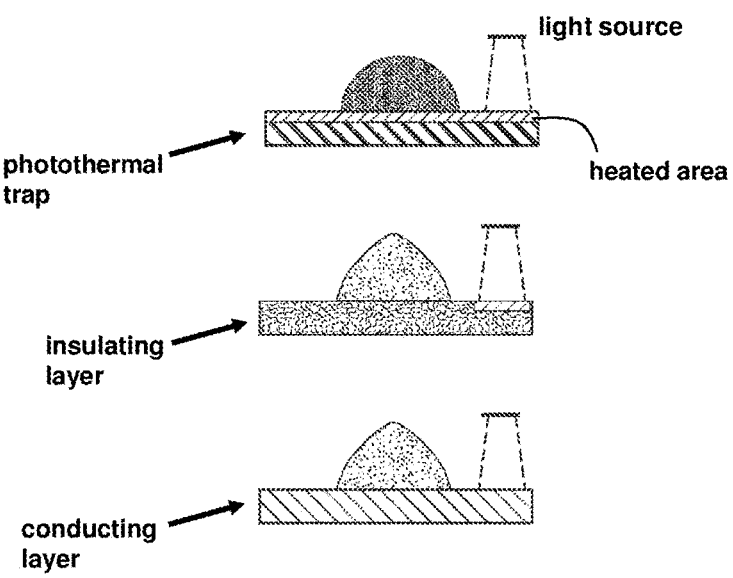
FIG. 3B shows illustrations of heating scenarios for a photothermal trap compared to reference cases, according to some embodiments.

Commercially available cermet was used as the absorber because of its high absorptivity α=95% and low emissivity of about 3% (see below). The low emissivity reduced the heat loss via radiation. The thin (less than 1 μm) absorber had high in-plane thermal resistance. Accordingly, a lateral thermal spreader was incorporated into the trap. The thermal spreader and the insulation were made of a 400 μm-thick aluminum layer and commercially available foam, respectively. As illustrated schematically in FIG. 3B, to highlight the advantage of the complementing properties of the three layers within the photothermal trap, the photothermal trap was compared to three reference cases without an absorber. One reference case used a device made of an insulating layer with high intrinsic absorptivity (carbon foam). The other two reference cases used a thick and a thin conducting layer (aluminum of thickness 6.3 mm and 400 μm; α=27% in the visible spectrum, see below). For the single insulating layer, the illumination-induced heat was restricted to the incident area of the beam. For the conductive layers, low absorptivity restricted the extent of temperature rise. Furthermore, for the insulating and thick conducting layers, the long thermal response time limited the rate of temperature increase. In contrast, photothermal trap according to this example maximized absorption and minimized the thermal response time, while restricting transverse heat loss, thus yielding maximum temperature rise for a given illumination (FIG. 3B). All reference surfaces had identical foam insulation at the backside to reduce heat loss, and were tested under the same illumination conditions as the photothermal trap.

Figure 3C:
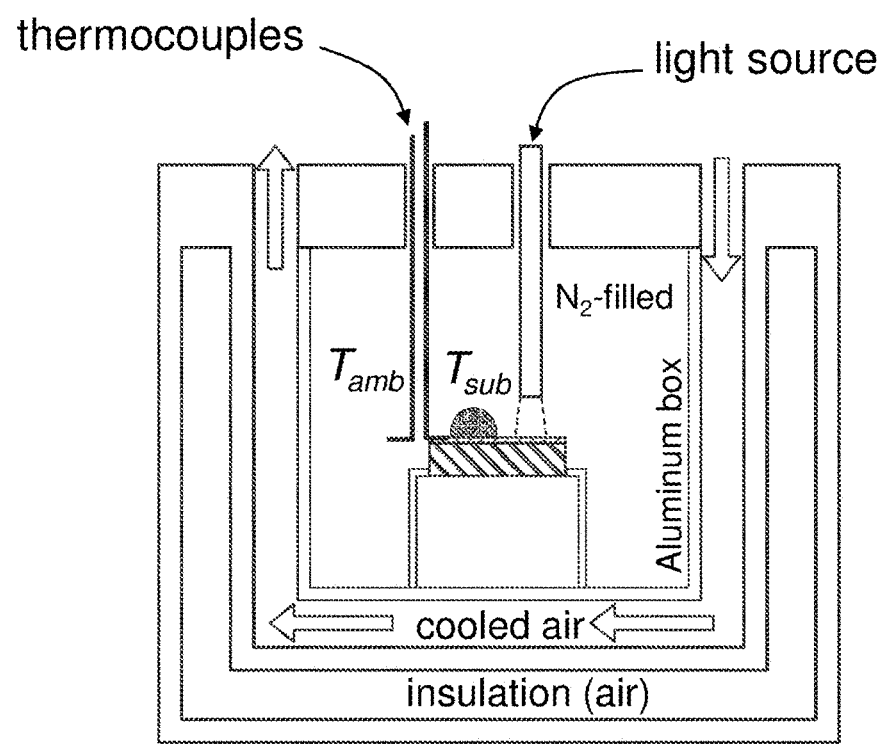
FIG. 3C shows a cross-sectional schematic of an experimental setup that can be used to measure the performance of a photothermal trap, according to some embodiments.
Figure 4A:
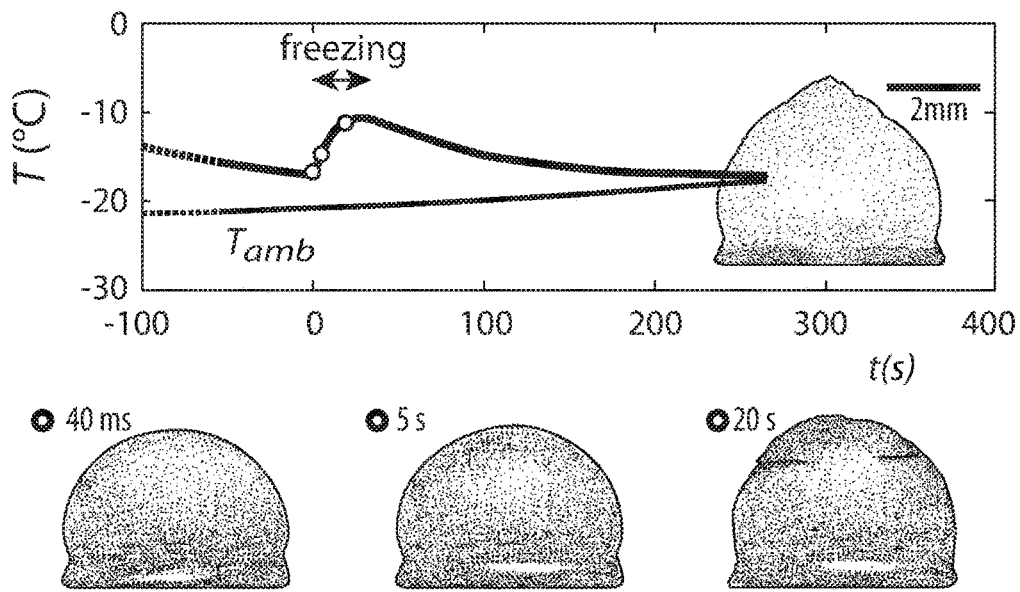
FIG. 4A shows, in accordance with certain embodiments, a data plot and snapshots corresponding to the freezing of a single drop of water.

Shown in FIG. 3C is a cross-sectional schematic of a specifically designed cold chamber, which was used to assess the performance of the photothermal trap according to this example. The cold chamber allowed for indirect, homogeneous cooling, while maintaining constant ambient temperature (see below). The freezing and melting of 40 μL droplets on each of the test surfaces, (each having an additional Teflon layer to ensure equal wetting properties (e.g., a contact angle of 120°) and clear visualization of the phase fronts) was studied. An exemplary data plot and snapshots are shown in FIG. 4A. To freeze a droplet, the surface temperature (the thick black curve in FIG. 4A) was slowly decreased by equilibration with a low-temperature ambient of approximately −20° C. (thin black curve in FIG. 4A). For below-zero surface temperature, the droplet first remained in a supercooled liquid state. The phase transition was induced with a small disturbance (see below). Freezing of the water droplet occurred in two well-known phases, namely recalescence and subsequent propagation of the freezing front. During recalescence, at t=0 s in FIG. 4A, the supercooled droplet suddenly became opaque within about 40 ms (see left snapshot in FIG. 4A). A fraction of the liquid froze, forming a slushy mixture of ice crystals and liquid at 0° C. Thereafter, the remaining liquid isothermally froze at a lower rate (in tens of seconds). As the latent heat was released through the high-conductivity surface of the photothermal trap, freezing proceeded bottom-to-top as shown in the middle and right snapshots, forming a pointy tip due to the expansion of water upon freezing. The temporary increase of the temperature (thick black curve in FIG. 4A) during phase change led to flash evaporation that supersaturated the gas surrounding the droplet, leading to a halo of condensed droplets (shown in the snapshots at 5 and 20 s). Slowly, the halo evaporated, and the surface temperature again decreased upon equilibration with the cold ambient. The frozen droplet was then equilibrated at the temperature to be studied.

Figure 4B:
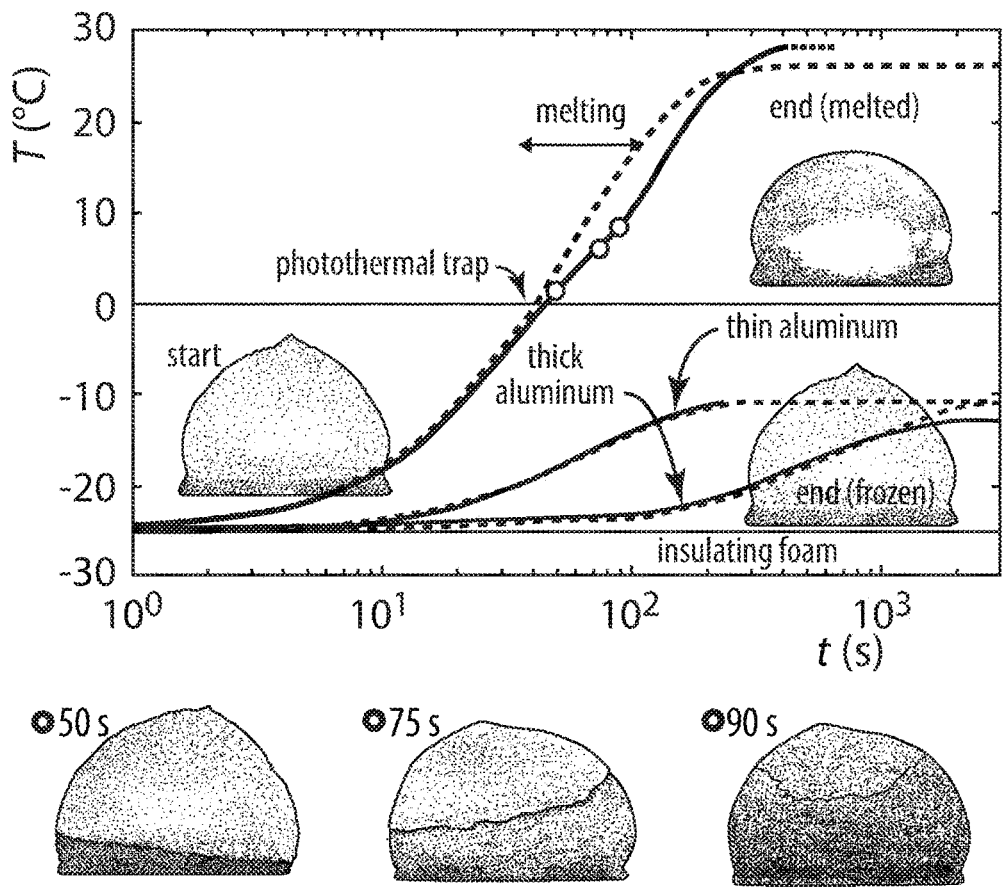
FIG. 4B shows, in accordance with certain embodiments, a data plot and snapshots corresponding to the melting of a single drop of water under illumination.
Figure 4C:
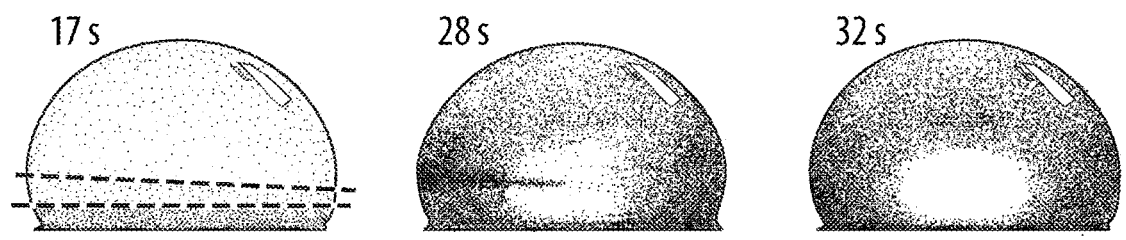
FIG. 4C shows, in accordance with certain embodiments, representative snapshots of melting on the photothermal trap when illuminated immediately upon recalescence.

FIG. 4B shows corresponding data plots and a set of snapshots for experiments where the substrates were illuminated with a halogen light source that had a maximum output radiation of 1.8 kW/m² and a spectrum similar to that of solar radiation. The maximum power was used in the laboratory-scale experiments unless otherwise specified, which amounted to approximately 1.8 times the maximum solar flux, or "1.8 sun". Additional experiments with 1.0 and 0.5 sun were performed to compare with actual sunlight conditions. FIG. 4B shows the thermal response curves upon illumination at an ambient temperature of −25° C. The insulating foam (curve shown in figure) did not heat up outside the immediate vicinity of the illuminated spot, which was always positioned away from the frozen droplet. For the thick (curve shown in figure) and thin (curve shown in figure) aluminum surfaces, the temperature rise was 15-17° C., which was insufficient to induce melting. Yet, the thermal time scale reduced by a factor of 10 when the metal thickness was reduced from 6.3 mm to 400 μm (from ~600 seconds to 60±5 seconds). The photothermal trap of this example had the same short time scale. In addition, combined with the high-performance absorber (cermet), the photothermal trap of this example yielded a temperature rise of 50-52° C. (curve shown in figure), thus leading to melting of the frozen droplet. Insets in FIG. 4B show the initial frozen droplet (left inset) and final state (melted or frozen; right insets). Snapshots in the lower row show intermediate steps in the progression of melting on the photothermal trap. The three snapshots displayed at the bottom of FIG. 4B show that melting started at the droplet-surface interface and propagated upward. The full-scale numerical model (explained below in Example 3, shown as dashed lines in corresponding curves in FIG. 4B) was consistent with the obtained equilibrium temperatures and timescales, as well as the full temporal temperature increase for non-melting drops. In the photothermal trap of this example, the latent heat consumed during the phase transition caused a temporary reduction in the rate of increase of the surface temperature, which was not captured by the model (thick black solid vs. thick black dashed lines in FIG. 4B). FIG. 4C shows an experiment where, to avoid this additional energy expenditure, the droplet was illuminated, at an ambient temperature of −15° C., as soon as recalescence occurred. The melting front (lower dashed line) caught up quickly with the arrested freezing front (upper dashed line, left snapshot). Subsequently, melting proceeded more rapidly for the mixed ice-liquid droplet than for a fully frozen droplet (2-3 times faster). Freezing could be completely eliminated by continuous illumination (thereby keeping the surface temperature high). However, because solar illumination is not always continuously and uniformly available, and illumination at the instant of recalescence requires precise monitoring of ice formation, the described study demonstrated the "worst-case" scenario of fully frozen droplets.

Laboratory-scale experiments were performed inside a specifically designed cold chamber (FIG. 3C) that allowed for cold stagnant ambient conditions via conductive cooling. It consisted of a multi-walled box with an inner controlled-atmosphere chamber that was purged with nitrogen before each experiment. It was surrounded by, successively, a shell to circulate cooled air to control the inner chamber temperature, a shell with stagnant air for insulation, and additional foam insulation layers. The cooled airflow was separated from the inner chamber by an aluminum wall that allowed good heat transfer yet blocked any airflow leakage. The inner chamber was thus cooled indirectly and had a stagnant nitrogen atmosphere, unless a shear flow was applied to the inner chamber purposefully. The cooling air was brought to the required temperature by flowing it through a slurry of dry ice and acetone at −87.5° C. The sample stage was aligned with a side view port for recording, and placed below a halogen fiber light (as a model for sunlight) that could be positioned accurately to fully contain the light spot within the test substrate area, but not directly on top of the droplet.

In a typical experiment, a 40-µL liquid droplet was first placed on the test surface. To achieve controlled freezing, the ambient temperature in the experimental chamber was cooled to below −20° C. while the substrate was illuminated to keep its temperature above zero. Subsequently, both illumination and cooling flow were turned off and the substrate (T) was allowed to equilibrate with the ambient ($T_{amb}$), as shown in FIG. 4A. Even close to temperature equilibration, near −20° C., the droplet remained in a supercooled state, so recalescence was induced by a small disturbance in the experimental chamber (an approximately one-second pulse of cooling flow). Upon recalescence the droplet temperature rose to 0° C.; this temperature was not measured in most experiments since an immersed thermocouple may disturb freezing and melting fronts. The measured surface temperature remained lower (e.g. −10° C. in FIG. 4A) because most of the released latent heat was consumed to heat up the liquid droplet and there was limited heat transfer to the surrounding environment. Upon freezing, the solid droplet assumed a symmetrical pointed shape. The surface and ambient temperature (and thus the frozen droplet) were then carefully equilibrated (typically within 0.5° C.) at the value of $T_{amb}$ required for the subsequent illumination experiment. The halogen fiber light supplied a maximum radiation of 1.8 kW/m². Upon illumination, a small cooling flow was kept and adjusted to keep the ambient temperature in the inner chamber constant (compensation for small heat losses from the experimental set-up). The recordings of the thermocouple temperatures (1 Hz) and videography (24 Hz) were carefully synchronized to be able to relate freezing and melting events to surface temperature.

The photothermal trap of this example remained intact during the entire duration of the study, which include repeated experiments with single droplets and frost formation (in both laboratory and outdoor experiments) on a single substrate, over a period of one year. No variation in absorptivity, photothermal trap efficiency, or wettability was perceived.

Figure 8:
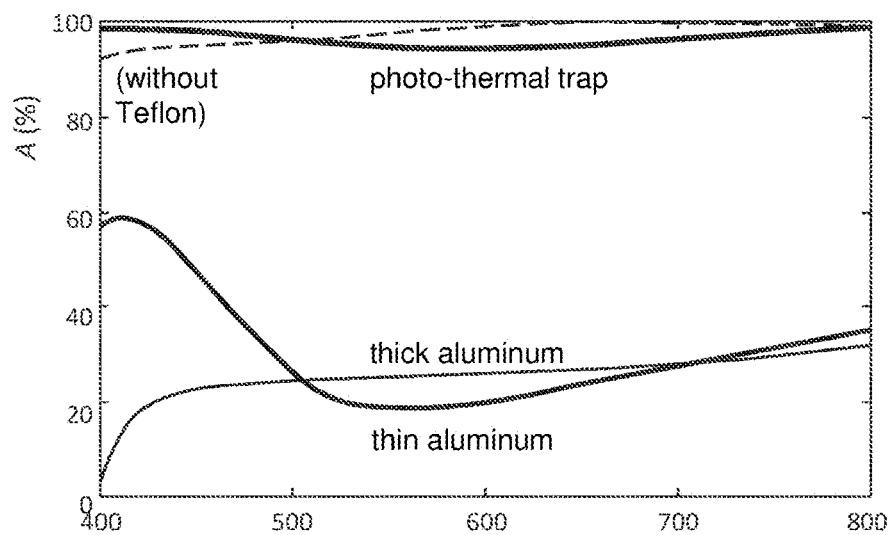
FIG. 8 shows, in accordance with certain embodiments, the measured absorptivity as a function of wavelength for various surfaces.

FIG. 8 shows measurements of the absorptivity of the different surfaces taken using a UV/Vis spectrophotometer. The data plot of FIG. 8 shows the measured absorptivity (%) as a function of wavelength (400-800 nm) for an exemplary photothermal trap coated with cermet versus uncoated aluminum (thin and thick sample: blue and black, respectively). All surfaces were coated with Teflon for hydrophobicity, except for the photothermal trap reference case indicated by the dashed line. The cermet (MT1300 Mirotherm®, Alanod GmbH) coating had greater absorptivity across all measured wavelengths compared to uncoated aluminum. The absorptivity was weighted for the spectral power distribution of a halogen source (color temperature: 3250 K) with an IR-filter, over the wavelength range of from 400 to 800 nm. This yielded an average absorptivity of 96% for the cermet-coated aluminum versus 27% for uncoated aluminum. These absorptivity values were used as parameter values in the numerical models described below. The presence of a hydrophobic Teflon layer had almost no effect on average absorptivity. For the full sunlight spectrum, the absorptivity of the cermet coating was specified by the supplier as 95±1%, indicating that this value would be similar for both laboratory and outdoor conditions.

Example 2

This example describes further experimentation, embodiments, and non-limiting theories regarding the mechanisms and parameters guiding deicing of surfaces by the photothermal trap. The materials and parameter values described in this example are non-limiting and by way of example, only.

Figure 6A:
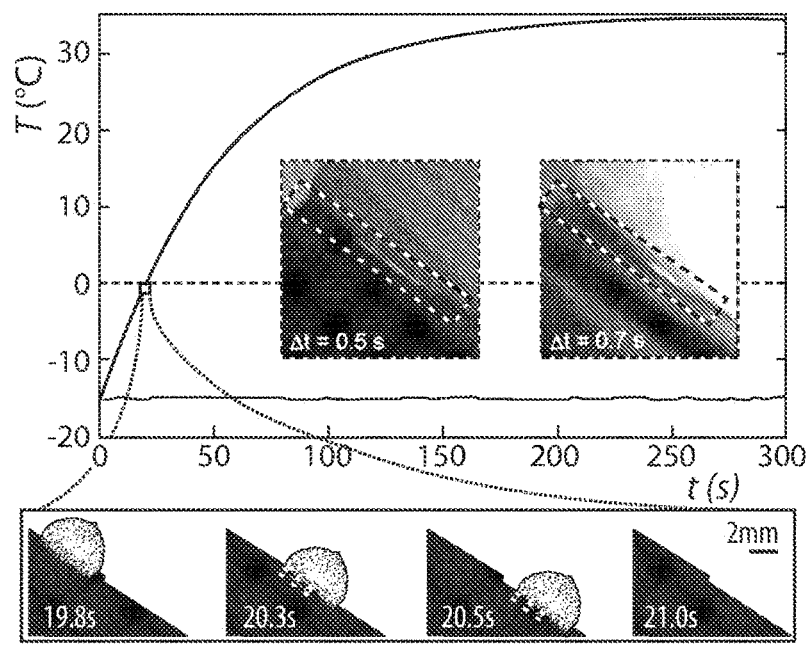
FIG. 6A shows, in accordance with certain embodiments, a data plot and snapshots corresponding to the sliding of a frozen drop on a 30° tilted exemplary phothermal trap.

The experimentation performed in this example demonstrated that a frozen droplet can be removed from the surface of the photothermal trap because of the melted interfacial layer—thus requiring only a very small fraction of the frozen drop to melt. FIG. 6A shows an experiment where a surface with a frozen droplet adhered to it placed at an angle of about 30° was illuminated with 1.8 kW/m² at an ambient temperature of −15° C. The drop volume was 40 µL. As soon as the surface temperature reached 0° C., (after an elapsed time of 19.8 seconds in this case), the droplet was dislodged from the surface and started sliding. The four snapshots shown in FIG. 6A show the position of the droplet at 0, 0.5, 0.7 and 1.2 seconds after illumination (all within the small black square on the curve in the main panel) with the insets highlighting the presence of the liquid film. The droplet was fully removed within approximately one second—as validated by the absence of latent heat effects on the temperature curve.

In general, the prompt removal of the ice greatly reduces the energy required for deicing, especially for thicker ice accumulations. In the case of forced convection, the heat transfer coefficient is dependent on the Reynolds number (Re) and the Prandtl number (Pr), as h=Nu k/L=0.664 $Re^{1/2}Pr^{1/3}$ (k/L). Keeping the thermophysical properties of the air constant, the heat transfer coefficient depends on the flow velocity and length scale as $$h \propto \left(\frac{v}{L}\right)^{0.5}.$$

Figure 10:
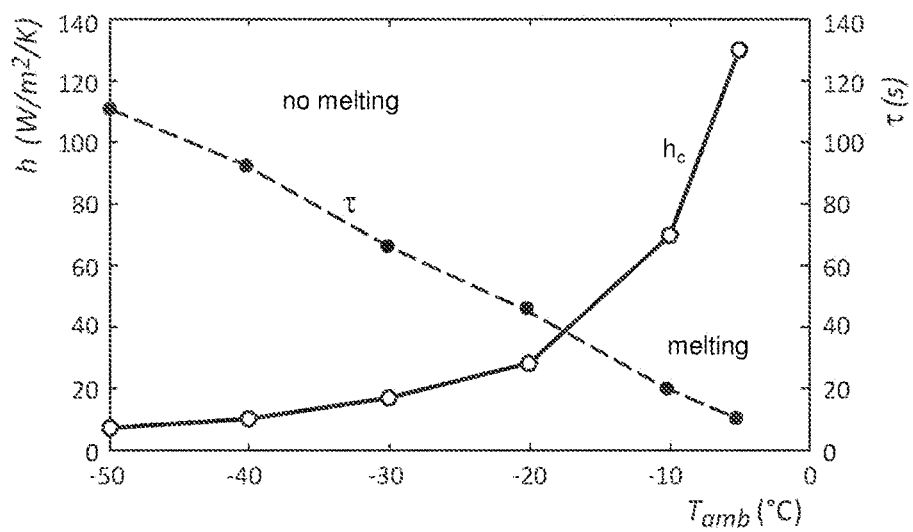
FIG. 10 shows, in accordance with certain embodiments, a plot produced by the modeling performed herein, showing the heat transfer coefficient parameter $h_c$ as function of ambient temperature and the characteristic time scale obtained at $h_c$.

While the large length scales in outdoor applications (typically meters instead of centimeters studied here) lead to lower heat transfer coefficients, strong winds and relative motion can lead to a significant increase of air convection. Extreme convective conditions, such as, on in-flight airplane wings may thus result in limited temperature rise, as shown in controlled experiments with an external flow. To demonstrate the limiting effect of the heat transfer coefficient, a full-scale numerical model (see below) was used to calculate the workable region of the photothermal trap. At a fixed ambient temperature, the workable range was limited by an upper value of the heat transfer coefficient that yielded a temperature rise that exactly compensates the ambient temperature ($\Delta T = -T_{amb}$), thus bringing the surface temperature to 0° C. This value $h_c$, is important, because at higher heat transfer coefficients melting will not be induced. FIG. 10 shows $h_c$ (curve indicated in the figure; for h<$h_c$ the trap induces melting, whereas for h>$h_c$ no melting is induced) over a range of ambient temperatures and at 1 sun illumination of the lab-scale photothermal trap of Example 1. The other curve (indicated in the figure) shows the corresponding time scale at $h_c$. If the critical heat transfer coefficient is low (harsh freezing conditions), the corresponding temperature increase will also be relatively slow. For milder ambient conditions, the heat transfer coefficient can be high, and if it is, the corresponding temperature increase will be fast. Numerical results shown in FIG. 10 correspond to illumination of the lab-scale photothermal trap with 1 kW/m².

Figure 11A:
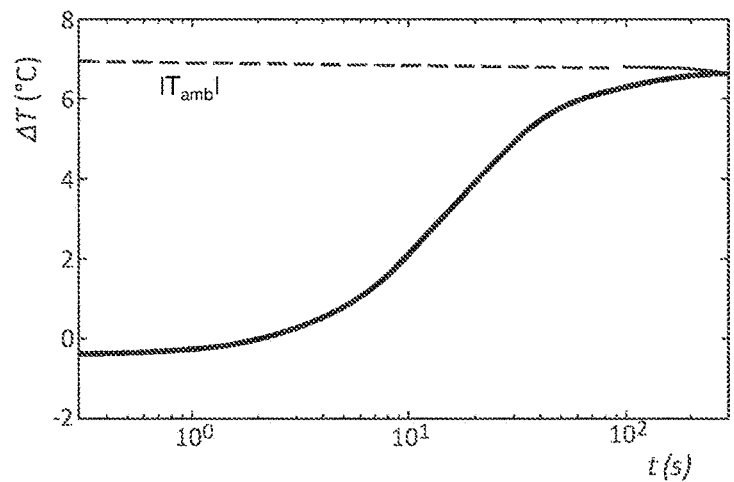
FIG. 11A shows, in accordance with certain embodiments, a plot of the heating curve for illumination of the photothermal trap experiencing a shear flow.
Figure 11B:
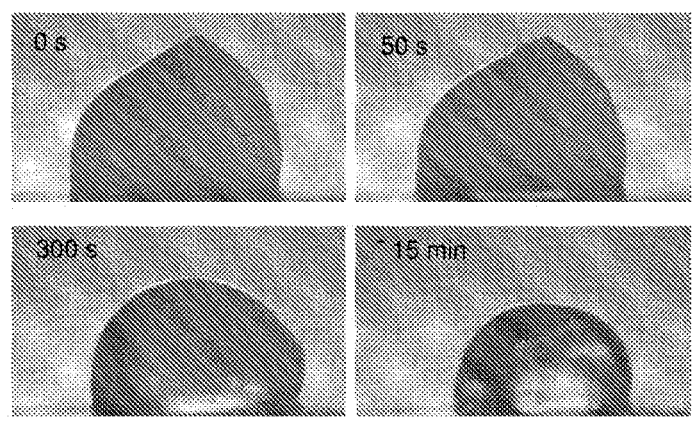
FIG. 11B shows, according to certain embodiments, snapshots showing intermediate steps in the progression of melting on the photothermal trap during the experimentation performed for FIG. 11A.

Lab-scale experiments under 1.0 kW/m² illumination led to a natural convective heat transfer coefficient h=15 W/m²/K, while values up to hundreds of W/m²/K are to be expected for in-flight aircraft conditions with ice-roughened wings. Buildings and solar panels experience a more moderate heat transfer coefficient of a few tens of W/m²/K, and the photothermal trap of Example 1 is expected to be feasible in these cases (see FIG. 10). A demonstration experiment at a higher heat transfer coefficient was performed using an external flow. Cooled nitrogen was led into the experimental chamber, flowing parallel to the test surface, and positioned such that it flowed directly over the surface. The ambient temperature was maintained around −7° C. FIG. 11A shows an experiment where a frozen droplet was illuminated with 1.0 kW/m² power, and it was found that the equilibrium temperature rise was 7° C. FIG. 11A shows a plot of the heating curve (thick black line) for the photothermal trap (dashed line) experiencing a shear flow leading to increased heat transfer coefficient h=49 W/m²/K Although the temperature rise shown in FIG. 11A is 5 times lower than the stagnant-air case, the temperature rise was sufficient to melt the droplet under the current experimental conditions, as shown in the snapshots in FIG. 11B. Melting started 40 seconds after illumination, but then proceeded only very slowly because the surface temperature stabilized exactly around 0° C. FIG. 11B shows that over the duration of 15 minutes, there was evaporation-induced reduction in drop volume. Because the surface reached exactly zero degree temperature, the experiment was performed at critical conditions, and the numerical modeling presented in FIG. 10 could be used to estimate the heat transfer coefficient. The observed characteristic time scale in the experiment, 20 seconds, indicated a heat transfer coefficient of about 70 W/m²/K. The corresponding temperature rise of 10° C. is in good agreement with the experimentally observed value (7° C.).

In summary, the degree to which the photothermal trap of Example 1 performs, at a given ambient temperature, is in part affected by the upper value of the heat transfer coefficient, which decreases with decreasing ambient temperature (as shown in FIG. 10). Depending on the harshness of air convection, such applications may, in some embodiments, require additional illumination. Applications with relatively low convective flow, such as buildings, solar panels, and wind turbines have comparable h to that studied here, leading to significant temperature rise.

Figure 6B:
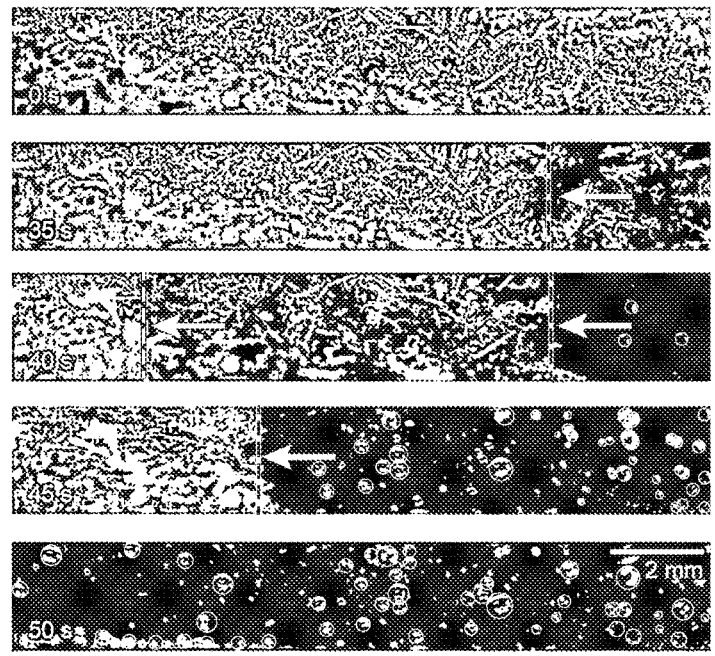
FIG. 6B shows, in accordance with certain embodiments, the melting of a frost layer on an exemplary photothermal trap.

The photothermal trap of Example 1 was effective not only for sparse droplets, but also for a variety of ice structures such as a frost layer or a dense layer of frozen condensate droplets. FIG. 6B shows illumination of a frost layer fully covering the surface and having a thickness of approximately one millimeter. The illumination was 1.8 kW/m² and the ambient temperature was −15° C. Melting of the interfacial layer started at the illumination spot within a few seconds of illumination and propagated along the entire length of the test photothermal trap (white dashed lines highlighting the change in contrast). The propagation of the melt layer was followed by a relatively slower bottom-up melting that led to the collapse of the frost layer (black dashed lines). Most of the liquid de-wetted the surface, leaving just a few residual microdroplets, as shown in the last panel of FIG. 6B. Because the surface was initially fully covered with frost, it was shown that the light was able to penetrate even semi-opaque ice structures.

Example 3

This example describes further experimentation, embodiments, and non-limiting theories regarding the mechanisms and parameters guiding deicing of surfaces by the photothermal trap. The materials and parameter values described in this example are non-limiting and by way of example, only.

Figure 7A:
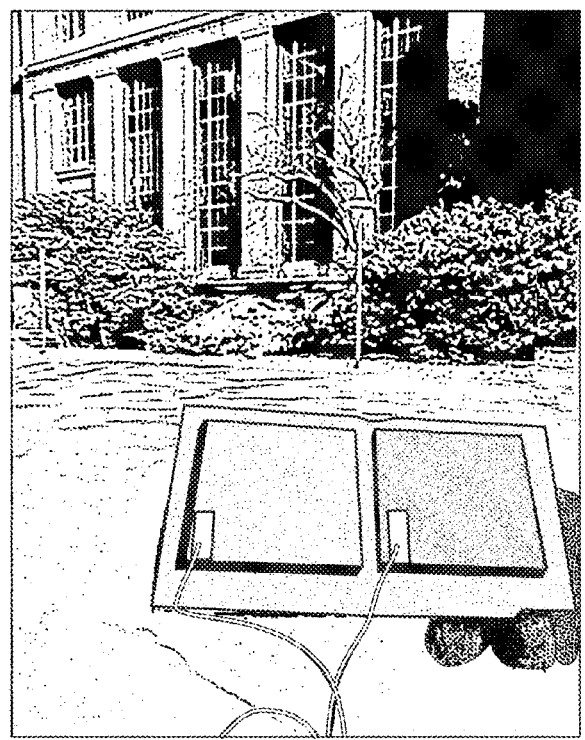
FIG. 7A shows, in accordance with certain embodiments, experimentation performed outside in Cambridge, Mass.
Figure 7B:
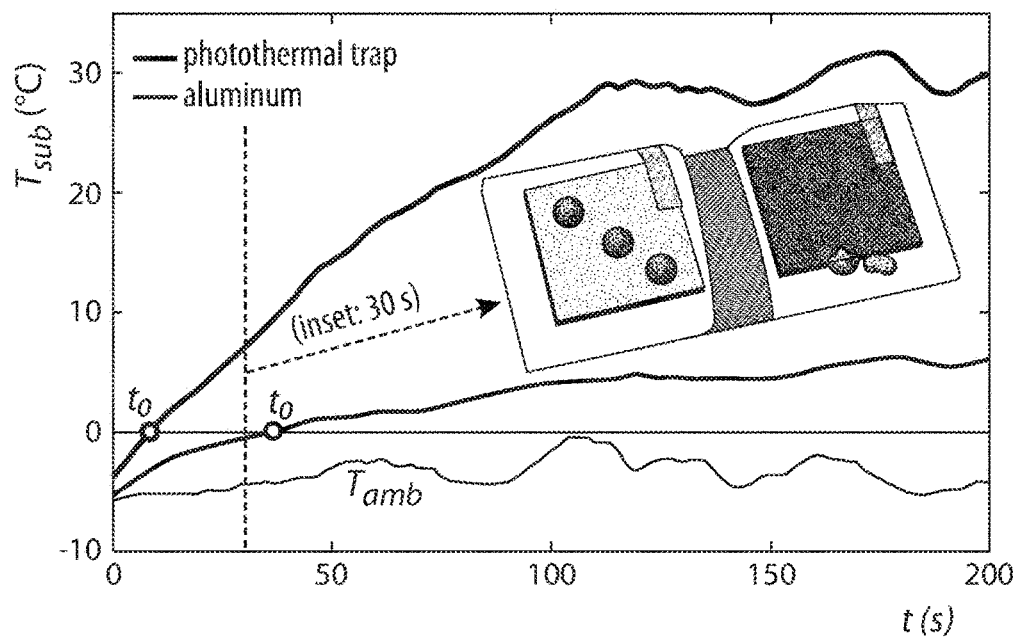
FIG. 7B shows, in accordance with certain embodiments, the temperature increase upon illumination of the panels shown in FIG. 7A, and a snapshot of the resulting sliding-off of frozen 0.5 mL puddles.
Figure 7C:
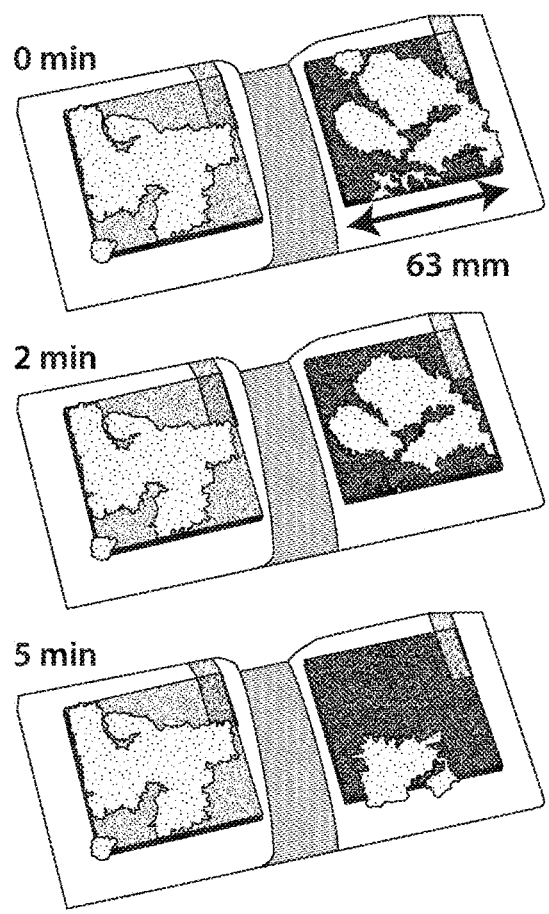
FIG. 7C shows, in accordance with certain embodiments, snapshots of the melting of snow on the exemplary photothermal trap and thin aluminum surface layer during the outside experiment.

The experimentation, as shown in FIG. 7A, of this example was performed outside, on a cold, windy, but sunny day. A solar intensity of 0.6±0.1 sun and an ambient temperature of −3.5±1.3° C. were measured during the experiment. The two panels shown in FIG. 7A are: (left) a thin aluminum surface layer and (right) an exemplary photothermal trap. Both had a 0.004 m² area. FIG. 7B shows the temperature increase of (medium thickness curve) a thin aluminum surface, and (thick curve) the photothermal trap of Example 1 upon exposure to the sun. The ambient temperature was below zero, and slightly fluctuating, −3.5±1.3° C. (thin black curve), due to variations in wind velocity and sun intensity. The solar intensity was ~0.6 kW/m². The two surfaces had a similar heating timescale, but the temperature rise on the photothermal trap was more than 3× higher: 37° C. versus 11° C. The photothermal trap thus showed a quick removal of pre-frozen 0.5 mL puddles that slid off the tilted surface as soon as the interfacial layer melted (see inset in FIG. 7B). For lower ambient temperatures (between −11° C. and −37° C.), the behavior between the photothermal trap and the aluminum surface would show even larger contrast, since the ice would melt on the trap, but not on the aluminum surface. As shown in FIG. 7C, a partial coverage of snow could be removed as well. FIG. 7C shows snapshots taken at 2 and 5 minutes after initial exposure to the sunlight (t=0). The interfacial melt layer enabled large patches of snow to slide off (lower snapshots).

Example 4

This example describes further non-limiting theories and modeling regarding the mechanisms and parameters guiding deicing of surfaces by the photothermal trap.

The modeling that was performed and described in this example is related to the performance of the photothermal trap of Example 1, as well as the reference surfaces. FIG. 3A shows the heat transfer processes involved in the system in which a frozen water droplet sits atop the photothermal trap. The parameter of interest in the modeling was the evolution of surface temperature T, because it dictates the melting of ice. The input radiative flux $q''_{in}=\alpha I$ was the absorbed incident radiation that causes a uniform temperature increase of the (metal) thermal spreader. The spreader loses heat by conduction into ice and insulation, and convection to the ambient. The energy balance for the thermal spreader with density ρ, specific heat capacity $c_p$ and thickness δ was given as:

$$\rho C_p \delta \frac{dT}{dt} = q''_{in} - h(1-s)(T - T_{amb}) - sq''_{ice} - q''_{ins} \tag{7}$$

Here, $T_{amb}$ was the ambient temperature, h was the convection heat transfer coefficient to the surrounding air, and s denoted the surface fraction of ice. $q''_{ice}$ and $q''_{ins}$ were respectively the heat flux into the ice layer and the insulating layer. In the experiments disclosed in this example, convection was solely buoyancy-driven and the magnitude of h depended on the relative difference in substrate and ambient temperature, and changes with the transient evolution of the substrate temperature (see below). Because the absorber of the photothermal trap of Example 1 was less than a micron thick, its thermal mass and resistance were neglected in the thermal transport analysis. The transient heat transfer in the ice and insulation layers was modeled as:

$$\rho_{ice} C_{p,ice} (dV_{ice}) \frac{dT_{ice}}{dt} = \quad (8)$$
$$-\frac{\partial}{\partial x}\left(-k_{ice}\left(A_{b,ice}\frac{\partial T_{ice}}{\partial x}\right)\right)\Delta x - h(dA_{ice})(T_{ice} - T_{amb})$$

$$\rho_{ins} C_{p,ins} (dV_{ins}) \frac{dT_{ins}}{dt} = \quad (9)$$
$$-\frac{\partial}{\partial x}\left(-k_{ins}\left(A_{b,ins}\frac{\partial T_{ins}}{\partial x}\right)\right)\Delta x - h_1(dA_{ins})(T_{ins} - T_{amb})$$

Here, $A_b$ denoted the basal area, dV was the volume, and dA was the surface area (exposed to air) of the discretized control volume; the subscripts denote ice or insulation, and $h_1$ is the heat transfer coefficient to the surrounding air from the insulating layer (see below for details). The heat flux into the ice and insulation were given by $q''_{ice} = k_{ice}\partial T_{ice}/\partial x|_{x_{ice}=0}$ and $q''_{ins} = -k_{ins}\partial T_{ins}/\partial x|_{x_{ice}=0}$. The coupled governing equations for energy transport through the thermal spreader, ice, and insulation were numerically solved to give the transient increase in surface temperature for various laminate design parameters and at different illumination and ambient conditions. The governing equations could be simplified by neglecting the heat loss through the insulation and thermal storage in ice to yield the transient increase of surface temperature as $\Delta T = \Delta T_{eq}(1-e^{-t/\tau})$, where $\Delta T_{eq} = q''_{in}/h_{eff}$ was the increase of surface temperature in steady state, and $\tau_s = \rho C_p \delta/h_{eff}$ was the thermal response time constant. Here $h_{eff}$ was the effective heat transfer coefficient, given as $h_{eff} = h(1-S)+s(hk_{ice}/(hL_{ice}+k_{ice}))$. This simple analytical solution was illustrative because it modeled the same exponential behavior as the full scale model and modeled the thermal time scale reasonably well; however, it over-estimated the steady state temperature rise substantially because it ignored heat loss through insulation and thermal storage in ice. For an accurate estimation of both the steady state temperature increase of the surface $\Delta T_{eq}$ and heating time scale $\tau_s$, a full-scale numerical model for comparison with the experimental data was used.

The heat transfer model was consistent with the ability of the photothermal trap to induce melting. Interfacial melting started when the surface temperature T increased to zero, or equivalently, when the surface temperature rise due to illumination $\Delta T$ overcame the ambient undercooling: that is, $\Delta T = -T_{amb}$. Setting this value in the exponential curve for $\Delta T$ from the full numerical model yielded the melting delay $t_0$, which was the time needed to initiate surface melting after start of illumination:

$$t_0 = -\tau \cdot \ln[1-|\Delta T_{eq}/T_{amb}|^{-1}] \text{ provided } |\Delta T_{eq}/T_{amb}|>1 \quad (10)$$

This melting delay time, under given ambient conditions, thus depended on the thermal properties of the trap that were captured by $\Delta T_{eq}$ and $\tau$, consistent with the numerical model. Moreover, surface designs that did not reach a sufficiently high equilibrium temperature, $|\Delta T_{eq}/T_{amb}|<1$, were unable to induce melting. Examples of such cases included the aluminum and insulating carbon foam surfaces under the ambient conditions shown in FIG. 4B.

Figure 5A:
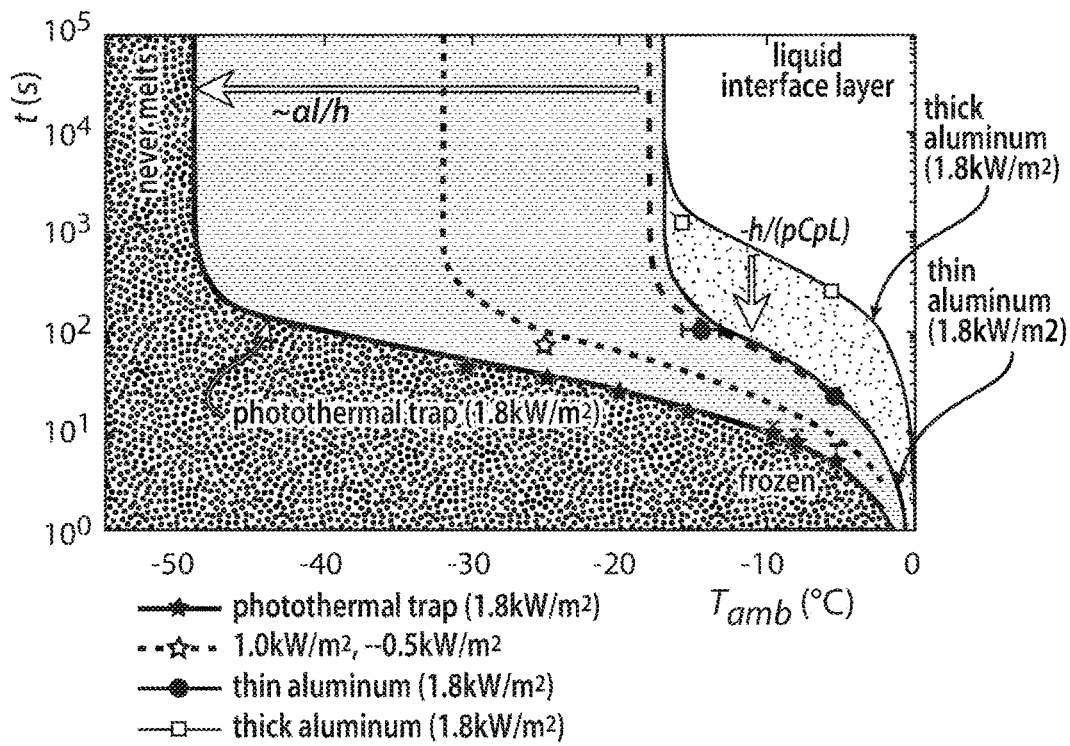
FIG. 5A shows, in accordance with certain embodiments, a performance diagram for the photothermal trap vs. reference surfaces.

FIG. 5A shows the estimated melting time ($t_0$ from Eq. (10)) as a function of ambient temperature, $T_{amb}$, for the photothermal trap and reference surfaces (difference curves) illuminated with 1.8 kW/m². This forms a 'performance' diagram that, for each surface, has two regions: above $t_0$ (at least) the surface layer of the droplet is liquid, allowing its instantaneous removal; below $t_0$ the droplet is completely frozen, and stuck. The observed onset of melting in single-drop experiments, as indicated by the markers, showed very good correspondence with the numerical modeling. Solid lines show the numerical results for the various substrates at 1.8 kW/m² illumination, while dashed lines indicate numerical results for the photothermal trap at varying illumination intensity: 1.0 and 0.5 kW/m² for the photothermal trap. White arrows with solid borders indicate (left) an increase in $\Delta T_{eq}$ (shift in asymptote) with increased absorbed energy, and (down) a decrease in timescale $\tau$ with decreased thermal mass.

Figure 5B:
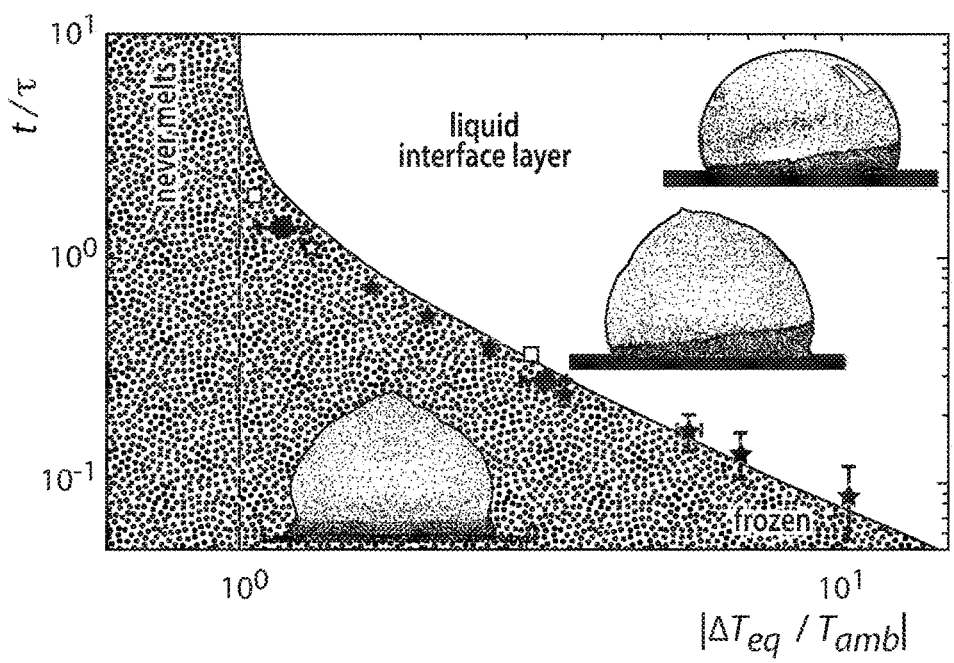
FIG. 5B shows, in accordance with certain embodiments, a non-dimensional phase diagram.

The superior performance of the photothermal trap could be explained directly from the reduced region of the performance diagram (below $t_0$) for which the drop stays frozen and has two aspects. First, the photothermal trap had very high $\Delta T_{eq} \sim 50°$ C., which significantly reduced the area where the drop remains frozen (left of the asymptote). Shrinking this area is of utmost importance to extend the working range of the laminate towards harsh conditions. The asymptote shifts to lower $T_{amb}$ with increasing absorptivity $\alpha$ (compare to $-17°$ C. for uncoated aluminum) and with increasing illumination intensity I (compare to dashed lines for 1.0 and 0.5 kW/m²) as indicated by the horizontal colored arrow. Second, for less harsh conditions that do allow melting, eventually, on all tested surfaces, the photothermal trap had the smallest melting delay $t_0$. Obtaining fast onset of melting, (e.g. within seconds to minutes), is particularly relevant in cases of fluctuating illumination intensity, or to reduce energy consumption when additional illumination (e.g. LEDs) is used. The melting delay was directly proportional to the thermal mass $\rho C_p \delta$ as indicated by the shortened $t_0$ (vertical colored arrow) comparing a thin with a thick aluminum surface. Yet, with the same thermal mass the photothermal trap also had superior behavior at any $T_{amb}$ right of the asymptote, since $t_0$ was also inversely proportional to $\Delta T_{eq}$ for conditions of abundant illumination. This could be shown by re-plotting the performance diagram in FIG. 5B as a function of the non-dimensionalized parameters $t_0/\tau$ and $|\Delta T_{eq}/T_{amb}|$, which collapsed the data on to a single curve. This performance diagram was consistent with the observed occurrence of melting, and its corresponding delay time $t_0$, based on the surface thermal properties captured by $\Delta T_{eq}$ and $\tau$ under known ambient conditions. In FIG. 5B, the markers correspond to same surfaces as those in FIG. 5A. FIG. 5B also shows representative snapshots of a 40-μL, droplet that highlight frozen and melted regions.

In the absence of forced convection, flow above the surface is solely-buoyancy driven, and was modeled as convection over a hot plate (in this case, the surface was heated by the absorbed incidence). The magnitude of h thus depended on the relative difference in surface and ambient temperature, and was given by $h=0.59Ra^{1/4}(k_{air}/L_c)$, where Ra is the Rayleigh number; $Ra=g\beta(T-T_{amb})[L_c^3/(\gamma\alpha)]$ where $\beta$ is the thermal expansion coefficient, $L_c$ is the characteristic length scale of the substrate, and $k_{air}$, $\gamma$ and $\alpha$ are the thermal conductivity, kinematic viscosity and thermal diffusivity of air, respectively. Below the insulation layer, the heat transfer will be influenced to some extent by the nature of the base substrate (note: its influence was minimized due to the presence of insulation). Here it was assumed that the heat transfer to the backside of the insulation was dictated by buoyant convection in the air. The heat transfer coefficient ($h_1$) at the insulation-air side was lower than h on the topside of the substrate and ice due to a lower temperature difference with respect to the ambient. Note: the thin metal layer at the top of the photo-thermal trap was considered at uniform temperature because the associated Biot number, $Bi=(h\delta)/k<0.1$. Here, $\delta$ and k were the thickness and thermal conductivity of the metal layer, respectively.

Figure 9:
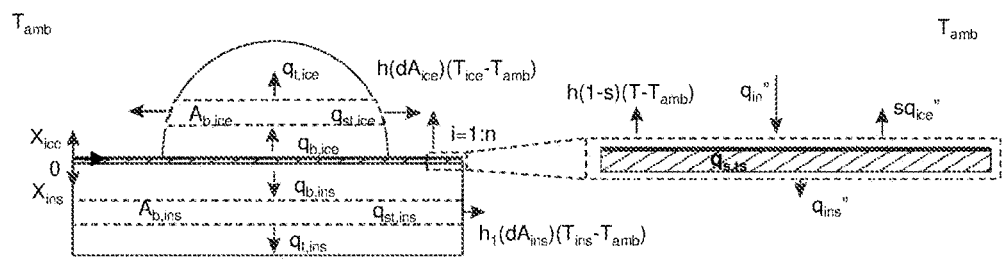
FIG. 9 shows, in accordance with certain embodiments, a diagram illustrating the control volume approach to modeling the transient temperature evolution of the thermal spreader upon illumination.

The governing equations, Eq. (7) through (9), were solved using finite volume method using a forward difference scheme in space and time to obtain the temporal substrate temperature. FIG. 9 shows a schematic of the control volume and discretization in the thermal spreader, ice and insulation layers. Control volumes were taken in the ice and insulation to find their respective temperature gradients, while the thermal spreader was at homogeneous temperature. The temperature of the substrate, ice and insulation were initially in equilibrium with the ambient. The boundary conditions were given by $T_{ice}|_{x_{ice}=0}=T$ and $T_{ins}|_{x_{ins}=0}=T$ at the plane of contact of ice ($x_{ice}=0$) and insulation ($x_{ins}=0$) with the metal layer, respectively. The other boundary condition was that the heat conducted through ice, or insulation, was equal to the heat convected at the ice-air, or insulation-air/base substrate, interface. The converged values of temperature at each time step were used to determine the corresponding thermophysical properties of air and heat transfer coefficients. The temperature profile of the thermal spreader was then curve-fitted using an exponential curve in the form of $\Delta T=\Delta T_{eq}(1-e^{-t/\tau})$ to determine the steady state temperature rise, $\Delta T_{eq}$ and thermal time constant, $\tau$.

The above non-limiting examples and related experimentation and modeling demonstrate the viability of a photothermal trap for deicing. The photothermal trap confined heat at the surface, and, roughly yielded an increase in surface temperature of 4° C. for an increase in illumination intensity of 0.1 kW/m$^2$ (which is a tenth of maximum solar intensity) under moderate convection conditions (=20 W/m$^2$/K). It was shown that solar illumination can result in a temperature rise as high as 33° C., making this an extremely energy efficient deicing approach. The operability of the photothermal trap can be extended to harsher freezing conditions by using additional illumination such as LEDs. Naturally, operation of LEDs comes with an energy expense that is higher than direct heating methods (due to their maximum 50% energy efficiency). Yet, the approach in the embodiments described herein allows for flexible designs that work under varying illumination conditions—freely available sunlight or augmented light—and does not need additional surface structuring to incorporate alternative heating methods. This approach can be easily integrated with existing systems, and allows for rapid melting of the interfacial ice layer, thus allowing for removal using gravity or moderate aerodynamic forces. Furthermore, this work also conceives of possibilities to further enhance photothermal deicing by coupling with other effects that induce thermal mismatch or other smart materials such as shape-memory alloys that respond to a change in temperature.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A photothermal trap, comprising:
   a thermal spreader; and
   an absorber over the thermal spreader, the absorber configured to absorb electromagnetic radiation;
   wherein:
      the photothermal trap is configured such that at least a portion of the electromagnetic radiation absorbed by the absorber is converted to heat that is transferred to the thermal spreader, and
      the photothermal trap has a thermal response time constant of less than or equal to 800 seconds.

2. The photothermal trap of claim 1, further comprising a thermal insulator under the thermal spreader.

3. The photothermal trap of claim 1, further comprising a hydrophobic surface on or over the absorber.

4. The photothermal trap of claim 1, wherein the thermal spreader is a thermally conductive solid.

5. The photothermal trap of claim 1, wherein the thermal spreader is a heat pipe.

6. The photothermal trap of claim 1, wherein the absorber has an absorptivity of at least 50% with respect to at least one wavelength of electromagnetic radiation within a band of wavelengths from 200 nm to 1 µm.

7. The photothermal trap of claim 1, wherein the absorber has an emissivity of less than or equal to 50% at a temperature of 25° C. with respect to at least one wavelength of electromagnetic radiation within a band of wavelengths from 200 nm to 1 µm.

8. The photothermal trap of claim 1, wherein the absorber has a broadband emissivity of less than or equal to 50% at a temperature of 25° C.

9. The photothermal trap of claim 1, wherein the thermal spreader has a thermal conductivity in a lateral direction of at least 50 W m$^{-1}$ K$^{-1}$ at 25° C.

10. The photothermal trap of claim 1, wherein there is a thermal transfer rate of at least 0.1 W between a first location and a second location in the thermal spreader separated in a lateral direction by a distance of at least 100 times the thickness of the thermal spreader, when the first and second locations have a difference in temperature of 1 Kelvin.

11. The photothermal trap of claim 1, further comprising a material disposed over the absorber, wherein the material undergoes a phase change in the temperature range of from −20° C. to 50° C.

12. The photothermal trap of claim 1, wherein the thermal spreader is in the form of a layer.

13. The photothermal trap of claim 1, wherein the absorber is in the form of a layer.

14. A photothermal trap, comprising:
   a first region having a thermal conductivity in a lateral direction of at least 50 W m$^{-1}$ K$^{-1}$ at 25° C.; and
   a second region, over the first region, the second region having an absorptivity of at least 50% with respect to at least one wavelength of electromagnetic radiation within a band of wavelengths from 200 nm to 1 µm;
   wherein the photothermal trap has a thermal response time constant of less than or equal to 800 seconds.

15. The photothermal trap of claim 14, further comprising a third region, under the first region, having a thermal conductivity in a transverse direction of less than or equal to 1 W m$^{-1}$ K$^{-1}$ at 25° C.

16. The photothermal trap of claim 14, further comprising a hydrophobic surface on or over the second region.

17. The photothermal trap of claim 14, wherein the first region is a solid.

18. The photothermal trap of claim 14, wherein the first region is a heat pipe.

19. A method of inducing or inhibiting a phase change of a material disposed over a photothermal trap comprising a thermal spreader, an absorber over the thermal spreader that is configured to absorb electromagnetic radiation, a thickness, and a lateral dimension perpendicular to the thickness, the method comprising:
   exposing the photothermal trap to electromagnetic radiation such that the electromagnetic radiation is absorbed by a first area of the photothermal trap that is part of the absorber and converted to heat that is transported along the lateral dimension of the photothermal trap via the thermal spreader to a second area of the photothermal trap resulting in the inducing or inhibiting of the phase change of the material over the second area of the photothermal trap,
   wherein the photothermal trap has a thermal response time constant of less than or equal to 800 seconds.

* * * * *